United States Patent
Lee et al.

(10) Patent No.: US 9,075,257 B2
(45) Date of Patent: Jul. 7, 2015

(54) DISPLAY DEVICE AND MANUFACTURING METHOD THEREOF

(71) Applicant: Samsung Display Co., Ltd., Yongin, Gyeonggi-do (KR)

(72) Inventors: Hee Keun Lee, Suwon-si (KR); Yeun Tae Kim, Suwon-si (KR); Nam Seok Roh, Seongnam-si (KR); Hae Ju Yun, Hwaseong-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 170 days.

(21) Appl. No.: 13/669,860

(22) Filed: Nov. 6, 2012

(65) Prior Publication Data

US 2013/0293798 A1   Nov. 7, 2013

(30) Foreign Application Priority Data

May 7, 2012   (KR) .......................... 10-2012-0048264

(51) Int. Cl.
*G02F 1/1333* (2006.01)
*G02F 1/1341* (2006.01)
*G02F 1/1343* (2006.01)
*G02F 1/1362* (2006.01)

(52) U.S. Cl.
CPC ........ *G02F 1/133345* (2013.01); *G02F 1/1341* (2013.01); *G02F 1/134309* (2013.01); *G02F 1/1362* (2013.01); *G02F 2001/133388* (2013.01)

(58) Field of Classification Search
CPC ............ G02F 1/133345; G02F 1/1341; G02F 1/134309
USPC .................................. 349/154, 156, 158, 160
See application file for complete search history.

(56) References Cited

U.S. PATENT DOCUMENTS

| | | | | |
|---|---|---|---|---|
| 4,095,876 | A | * | 6/1978 | Horsting et al. ............... 349/154 |
| 5,956,112 | A | * | 9/1999 | Fujimori et al. ............... 349/156 |
| 6,970,223 | B2 | | 11/2005 | Lee et al. |
| 7,382,432 | B2 | | 6/2008 | Yanagawa et al. |
| 7,483,369 | B2 | | 1/2009 | Chavez et al. |
| 7,486,369 | B2 | | 2/2009 | Niwa et al. |
| 8,054,438 | B2 | | 11/2011 | Lee et al. |
| 2002/0014303 | A1 | | 2/2002 | Kotani et al. |
| 2002/0149732 | A1 | * | 10/2002 | Youn ............................. 349/153 |
| 2005/0073637 | A1 | | 4/2005 | Liao |
| 2007/0024778 | A1 | | 2/2007 | Kametani et al. |
| 2007/0126973 | A1 | * | 6/2007 | Ikeda et al. .................... 349/155 |
| 2007/0165172 | A1 | * | 7/2007 | Takatori et al. ............... 349/139 |

FOREIGN PATENT DOCUMENTS

| | | |
|---|---|---|
| JP | 08-106084 | 4/1996 |
| JP | 09-090380 | 4/1997 |
| JP | 2000-193984 | 7/2000 |
| JP | 2001-183680 | 7/2001 |

(Continued)

*Primary Examiner* — Michael Caley
(74) *Attorney, Agent, or Firm* — F. Chau & Associates, LLC

(57) ABSTRACT

A display device includes a substrate including a pixel area, a thin-film transistor formed on the substrate, a pixel electrode connected to the thin-film transistor, a common electrode formed on the pixel electrode, a space formed between the pixel electrode and the common electrode, and a roof layer formed on the common electrode. The common electrode and the roof layer include a protrusion protruding from at least one of an upper edge and a lower edge of the pixel area.

15 Claims, 23 Drawing Sheets

(56) References Cited

FOREIGN PATENT DOCUMENTS

| | | |
|---|---|---|
| JP | 2006-276372 | 10/2006 |
| JP | 2008-033117 | 2/2008 |
| JP | 2008-129327 | 6/2008 |
| JP | 2008-242031 | 10/2008 |
| JP | 4747133 | 5/2011 |
| KR | 1020020047748 | 6/2002 |
| KR | 10-0354252 | 9/2002 |
| KR | 1020060080760 | 7/2006 |
| KR | 1020070012051 | 1/2007 |
| KR | 1020080049193 | 6/2008 |
| KR | 1020110016643 | 2/2011 |
| KR | 1020120026880 | 3/2012 |

* cited by examiner

DISPLAY DEVICE AND MANUFACTURING METHOD THEREOF

CROSS-REFERENCE TO RELATED APPLICATION

This application claims priority under 35 U.S.C. §119 to Korean Patent Application No. 10-2012-0048264, filed on May 7, 2012, the disclosure of which is incorporated by reference herein in its entirety.

TECHNICAL FIELD

The present invention relates to a display device and a manufacturing method thereof. More particularly, the present invention relates to a display device that prevents or reduces light leakage near a liquid crystal injection hole, and a manufacturing method thereof.

DISCUSSION OF THE RELATED ART

A liquid crystal display includes two substrates and a liquid crystal layer interposed between the substrates. An electric field is generated in the liquid crystal layer by applying a voltage to field generating electrodes. The electric field adjusts the alignment of liquid crystal molecules of the liquid crystal layer, allowing an image to be displayed.

A gate line transmitting a gate signal and a data line transmitting a data signal are formed in the liquid crystal display, and a thin-film transistor connected to the gate line, the data line, and a pixel electrode may be formed. The liquid crystal display may further include a backlight, a light blocking member, a color filter, and a common electrode. Light leakage occurring in the liquid crystal display may reduce the quality of displayed images.

SUMMARY

According to an exemplary embodiment of the present invention, a display device includes a substrate including a pixel area, a thin-film transistor formed on the substrate, a pixel electrode connected to the thin-film transistor and formed in the pixel area, a common electrode formed on the pixel electrode, a space formed between the pixel electrode and the common electrode, a roof layer formed on the common electrode and made of an organic material, and an overcoat formed on the roof layer and sealing the space for each pixel area. The common electrode and the roof layer include a protrusion protruding from at least one of an upper edge and a lower edge of the pixel area.

According to an exemplary embodiment of the present invention, a manufacturing method of a display device includes forming a thin-film transistor on a substrate including a pixel area, forming a pixel electrode connected to the thin-film transistor in the pixel area, forming a sacrificial layer on the pixel electrode, forming a common electrode covering an upper surface, a left surface, and a right surface of the sacrificial layer, forming a roof layer of an organic material on the common electrode, patterning the roof layer and the common electrode to expose the sacrificial layer on the upper edge and lower edge of the pixel area, thereby forming a liquid crystal injection hole, removing the sacrificial layer to form a space between the pixel electrode and the common electrode, injecting a liquid crystal layer in the space through the liquid crystal injection hole, and forming an overcoat on the roof layer to seal the space for the pixel area. The liquid crystal injection hole, the overcoat and the common electrode are patterned such that the overcoat and the common electrode include a protrusion protruding from at least one of the upper edge and the lower edge of the pixel area.

According to an exemplary embodiment of the present invention, the common electrode and the roof layer in a pixel area include a protrusion near the liquid crystal injection hole such that a meniscus of the liquid crystal layer is disposed outside of the pixel area, which may reduce or prevent light leakage near the liquid crystal injection hole in the pixel area.

According to an exemplary embodiment of the present invention, transmissive axes of the polarizers are parallel or perpendicular to the upper edge and the lower edge of the pixel area such that light leakage may be prevented or reduced at the edges of the pixel area.

According to an exemplary embodiment of the present invention, a pixel area of a display device includes a pixel electrode, a common electrode, and a liquid crystal layer disposed between the pixel electrode and the common electrode. A meniscus of the liquid crystal layer extends beyond an outer periphery of the pixel area.

BRIEF DESCRIPTION OF THE DRAWINGS

The above and other features of exemplary embodiments of the present invention will become more apparent by describing in detail exemplary embodiments thereof with reference to the accompanying drawings, in which.

DETAILED DESCRIPTION OF THE EXEMPLARY EMBODIMENTS

Figure 1:
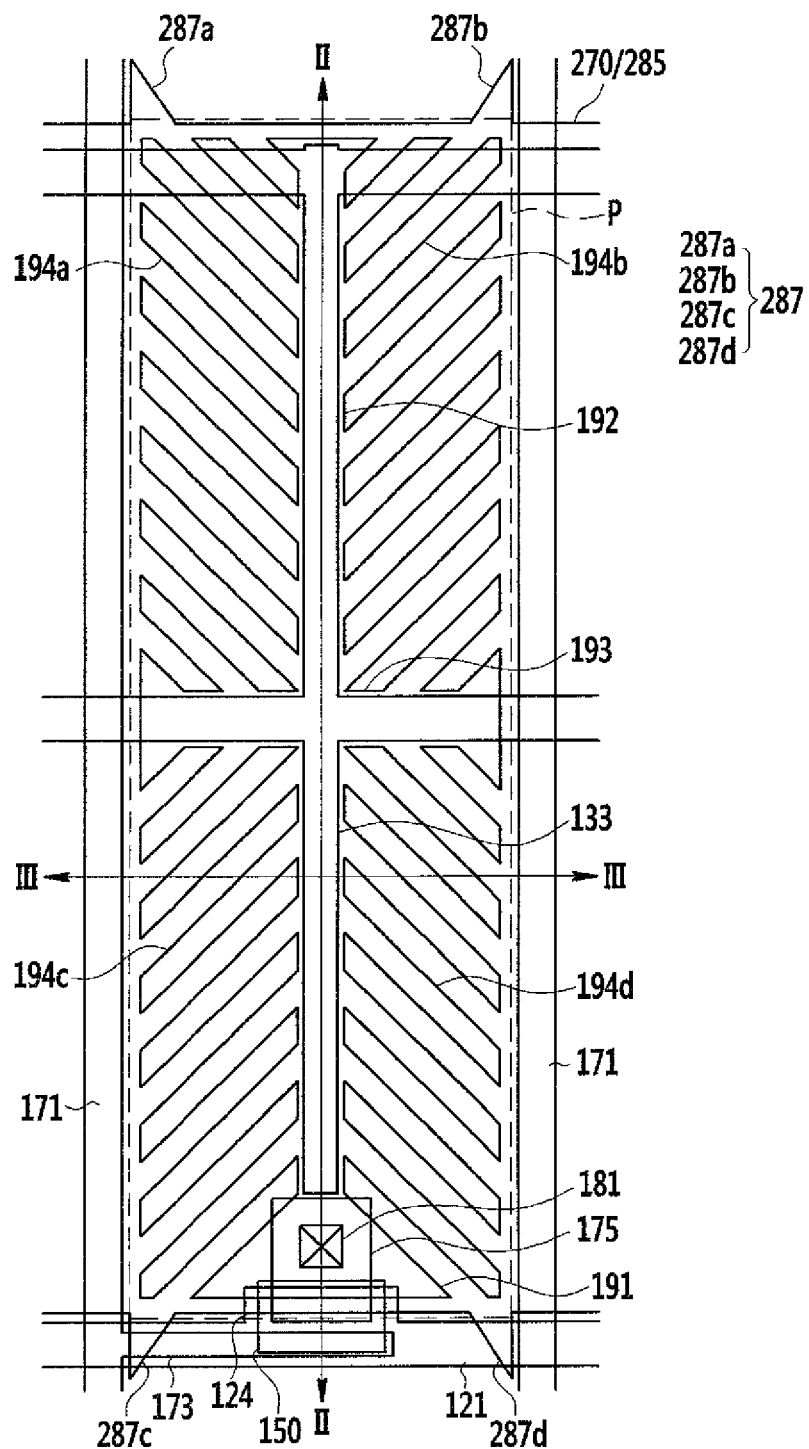
FIG. 1 is a top plan view of one pixel of a display device, according to an exemplary embodiment of the present invention.

Exemplary embodiments of the present invention will be described more fully hereinafter with reference to the accompanying drawings. Like reference numerals may refer to like elements throughout the accompanying drawings.

It will be understood that when an element such as a layer, film, region, or substrate is referred to as being "on" another element, it can be directly on the other element or intervening elements may also be present.

A display device according to an exemplary embodiment of the present invention will be described with reference to FIGS. 1 to 4.

Figure 2:
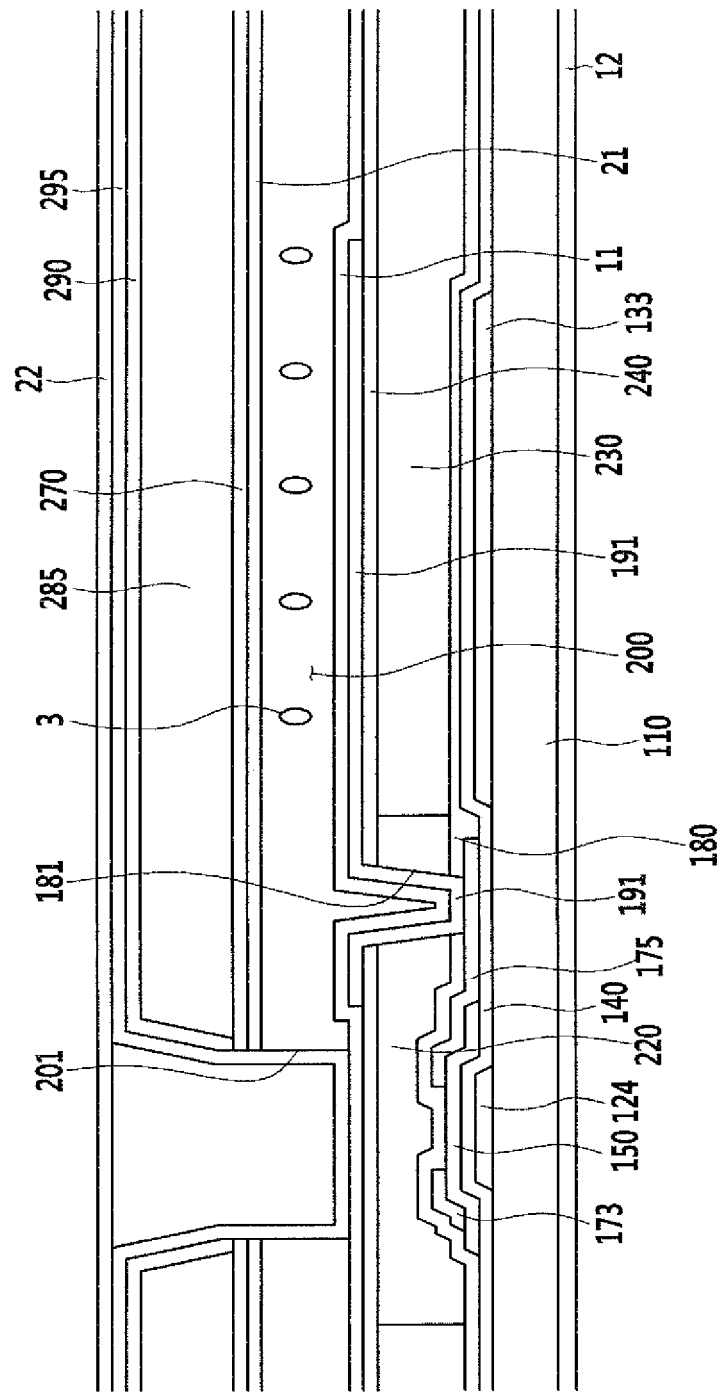
FIG. 2 is a cross-sectional view of one pixel of a display device taken along line II-II of FIG. 1, according to an exemplary embodiment of the present invention.
Figure 3:
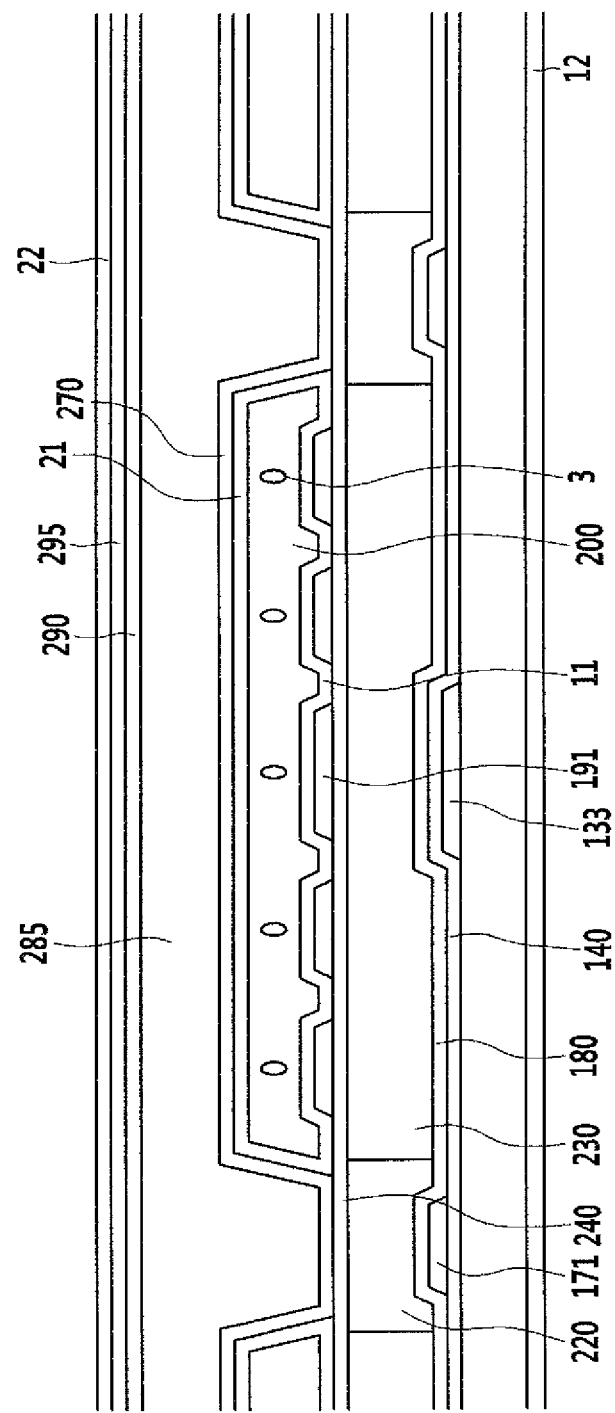
FIG. 3 is a cross-sectional view of one pixel of a display device taken along line III-III of FIG. 1, according to an exemplary embodiment of the present invention.

FIG. 1 is a top plan view of one pixel of a display device, according to an exemplary embodiment of the present invention. FIG. 2 is a cross-sectional view of one pixel of a display device, according to an exemplary embodiment of the present invention taken along line II-II of FIG. 1. FIG. 3 is a cross-sectional view of one pixel of a display device, according to an exemplary embodiment of the present invention taken along line III-III of FIG. 1.

A display device according to the exemplary embodiment shown in FIG. 1 includes a gate line 121 formed in a first direction, and a data line 171 formed in a second direction crossing the first direction on a substrate 110. The substrate may be made of, for example, glass or plastic.

The substrate 110 includes a plurality of pixel areas P, and the plurality of pixel areas P may be arranged in a matrix shape defined by the gate lines 121 and the data lines 171.

Each gate line 121 extends in a transverse direction, or substantially in a transverse direction and transmits a gate signal. The gate lines 121 include a gate electrode 124 protruding therefrom. The gate electrode 124 is applied with the gate signal through the gate line 121.

A storage electrode 133 may be formed in the pixel area P. The storage electrode 133 is not connected to the gate line 121 or the gate electrode 124, and may be formed in a direction parallel to, or substantially parallel to the data line 171. Alternatively, the storage electrode 133 may be formed in a direction parallel to, or substantially parallel to the gate line 121. A plurality of storage electrodes 133 formed in the neighboring pixel areas P may be connected to each other. The storage electrode 133 may be applied with a predetermined voltage such as, for example, a common voltage.

As shown in FIG. 2, a gate insulating layer 140 is formed on the gate line 121, the gate electrode 124, and the storage electrode 133. The gate insulating layer 140 may be made of an inorganic insulating material such as, for example, silicon nitride (SiNx) or silicon oxide (SiOx). The gate insulating layer 140 may be a single layer or a multilayer.

A semiconductor layer 150 is formed on the gate insulating layer 140. The semiconductor layer 150 may be positioned on the gate electrode 124, and may be extended under the data line 171. The semiconductor layer 150 may be made of, for example, amorphous silicon, polycrystalline silicon, or a metal oxide.

A source electrode 173 protruding from the data line 171, and a drain electrode 175 separated from the source electrode 173, are formed on the semiconductor layer 150.

The data line 171 extends in a longitudinal direction, or substantially longitudinal direction and transmits a data signal. The data signal transmitted to the data line 171 is applied to the source electrode 173.

The gate electrode 124, the semiconductor layer 150, the source electrode 173, and the drain electrode 175 form one thin-film transistor. When the thin-film transistor is in an on state, the data signal applied to the source electrode 173 is transmitted to the drain electrode 175.

A passivation layer 180 is formed on the data line 171, the source electrode 173, the drain electrode 175, and the exposed semiconductor layer 150 between the drain electrode 175 and the source electrode 173. The passivation layer 180 may be made of, for example, an organic insulating material or an inorganic insulating material, and may be a single layer or a multilayer.

A color filter 230 is formed in each pixel area P on the passivation layer 180. Each of the color filters 230 may display a primary color (e.g., red, green, or blue), however the color filters 230 are not limited thereto. For example, the color filters 230 may also display colors such as, for example, cyan, magenta, yellow, or other colors including white.

A light blocking member 220 is formed in a region between the neighboring color filters 230. The light blocking member 220 is formed on the boundary of the pixel area P and the thin-film transistor, and as a result, may prevent light leakage.

A first insulating layer 240 may be formed on the color filter 230 and the light blocking member 220. The first insulating layer 240 may be made of an inorganic insulating material such as, for example, silicon nitride (SiNx) or silicon oxide (SiOx). The first insulating layer 240 protects the color filter 230 and the light blocking member 220. Exemplary embodiments may not include the first insulating layer 240.

The first insulating layer 240, the light blocking member 220, and the passivation layer 180 have a contact hole 181 exposing a portion of the drain electrode 175. In an exemplary embodiment, the contact hole 181 may be formed in the color filter 230 instead of the light blocking member 220.

A pixel electrode 191 connected to the drain electrode 175 through the contact hole 181 is formed on the first insulating layer 240. The pixel electrode 191 is formed in each pixel area (P), and is connected to the drain electrode 175, thereby receiving the data signal from the drain electrode 175 when the thin-film transistor is in the on state. The pixel electrode 191 may be made of a transparent metal material such as, for example, indium-tin oxide (ITO) or indium-zinc oxide (IZO).

The pixel electrode 191 includes a transverse stem 193, a longitudinal stem 192 crossing the transverse stem 193, and a plurality of first to fourth minute branches 194a, 194b, 194c, and 194d.

The transverse stem 193 may be formed in a direction parallel to, or substantially parallel to the gate line 121, and the longitudinal stem 192 may be formed in a direction parallel to, or substantially parallel to the data line 171. The transverse stem 193 may be positioned at an approximate center area between the two neighboring gate lines 121, and the longitudinal stem 192 may be positioned at an approximate center area between the two neighboring data lines 171.

One pixel area (P) is divided into a first sub-pixel area, a second sub-pixel area, a third sub-pixel area, and a fourth sub-pixel area by the transverse stem 193 and the longitudinal stem 192. Referring to FIG. 1, the first sub-pixel area is positioned at the left side of the transverse stem 193 and at an upper side of the longitudinal stem 192, the second sub-pixel area is positioned at the right side of the transverse stem 193 and at the upper side of the longitudinal stem 192, the third sub-pixel area is positioned at the left side of the transverse stem 193 and at the lower side of the longitudinal stem 192, and the fourth sub-pixel area is positioned at the right side of the transverse stem 193 and at the lower side of the longitudinal stem 192.

The first minute branches 194a are formed in the first sub-pixel area, the second minute branches 194b are formed in the second sub-pixel area, the third minute branches 194c are formed in the third sub-pixel area, and the fourth minute branches 194d are formed in the fourth sub-pixel area.

The first minute branches 194a are obliquely extended from the transverse stem 193 or the longitudinal stem 192 in the upper-left direction, the second minute branches 194b are obliquely extended from the transverse stem 193 or the longitudinal stem 192 in the upper-right direction, the third minute branches 194c are obliquely extended from the transverse stem 193 or the longitudinal stem 192 in the lower-left direction, and the fourth minute branches 194d are obliquely extended from the transverse stem 193 or the longitudinal stem 192 in the lower-right direction.

The first to fourth minute branches 194a-194d may form an angle of about 45 degrees or about 135 degrees with the gate line 121 or the transverse stem 193, and the first to fourth minute branches 194a-194d of neighboring sub-pixel areas form right angles, or substantially form right angles.

The shape of the pixel electrode 191 is not limited to the shape shown in FIG. 1, and variations are possible according to exemplary embodiments. Further, the number of sub-pixel areas in a single pixel area (P) is not limited to four, as shown in FIG. 1. For example, according to exemplary embodiments, a single pixel area (P) may include more or less than four sub-pixel areas. In addition, the number, orientation, and spacing of the first to fourth minute branches 194a-194d as shown in FIG. 1 is exemplary, and exemplary embodiments of the present invention are not limited thereto.

A common electrode 270 separated from the pixel electrode 191 by a predetermined distance is formed on the pixel electrode 191. A space 200 is formed between the pixel electrode 191 and the common electrode 270, and a liquid crystal layer including liquid crystal molecules 3 is formed in the space 200. The liquid crystal molecules 3 may be aligned in a direction perpendicular to, or substantially perpendicular to the substrate 110 in the absence of an electric field.

In the exemplary embodiment described above, the pixel electrode 191 is formed at an upper side with reference to the space 200, and the common electrode 270 is formed at a lower side with reference to the space 200, however exemplary embodiments of the present invention are not limited thereto. For example, in an exemplary embodiment, the pixel electrode 191 and the common electrode 270 may be both positioned above or under the space 200. The pixel electrode 191 and the common electrode 270 may be formed in the same layer, or may be formed in different layers with an insulating layer interposed therebetween. The liquid crystal molecules 3 formed in the space 200 may be slanted in a direction parallel to, or substantially parallel to the substrate 110.

A first alignment layer 11 is formed on the pixel electrode 191. The first alignment layer 11 may be formed on a portion of the first insulating layer 240 that is not covered by the pixel electrode 191.

A second alignment layer 21 facing the first alignment layer 11 is formed under the common electrode 270.

The first alignment layer 11 and the second alignment layer 21 may be vertical alignment layers, and may be made of a material such as, for example, polyamic acid, polysiloxane, or polyimide. The first and second alignment layers 11 and 21 may be connected to each other on the edge of the pixel area (P).

The space 200 is enclosed by the first insulating layer 240, the pixel electrode 191, and the common electrode 270. The common electrode 270 directly contacts the first insulating layer 240 at the portion overlapping the data line 171. As a result, the common electrode 270 covers the right surface and the left surface of the space 200 in the portion near the data line 171. That is, the common electrode 270 encloses the right portion and the left portion of the pixel area (P). The common electrode 270 is connected to the pixel areas (P) neighboring in the row direction.

The common electrode 270 is not connected to the pixel areas (P) neighboring in the column direction. That is, the common electrode 270 does not cover most of the upper surface and the lower surface of the space 200 in the portion neighboring the gate line 121. Accordingly, a liquid crystal injection hole 201 is formed for the space 200 to be exposed to the outside at the upper surface and the lower surface of the space 200. That is, the liquid crystal injection hole 201 is formed according to the gate line 121, and the liquid crystal molecules 3 are injected inside the space 200 through the liquid crystal injection hole 201.

In the exemplary embodiment described above, the common electrode 270 covers the left surface and the right surface of the space 200 and does not cover the upper surface and the lower surface, however exemplary embodiments of the present invention are not limited thereto. For example, the common electrode 270 may cover other surfaces of the space 200. That is, in an exemplary embodiment, the common electrode 270 may cover the lower surface and the upper surface, and not cover the right surface and the left surface. The liquid crystal injection hole 201 may be formed according to the data line 171.

In an exemplary embodiment, an insulating layer made of an inorganic insulating material such as, for example, silicon nitride (SiNx) or silicon oxide (SiOx) may be further formed on the common electrode 270.

A roof layer 285 is formed on the common electrode 270. The roof layer 285 may be made of an organic material.

A second insulating layer 290 may be further formed on the roof layer 285. The second insulating layer 290 may be made of an inorganic insulating material such as, for example, silicon nitride (SiNx) or silicon oxide (SiOx). The second insulating layer 290 may cover the entire upper surface and side surface of the roof layer 285. The second insulating layer 290 protects the roof layer 285. In exemplary embodiments, the second insulating layer 290 may not be included.

The common electrode 270 and the roof layer 285 may include a protrusion 287 protruding from an upper edge and a lower edge of the pixel area (P). The protrusion 287 protrudes from first and second ends (e.g., a left end and a right end, respectively) of the upper edge of the pixel area (P), and first and second ends (e.g., a left end and a right end, respectively) of the lower edge of the pixel area (P).

The protrusion 287 may be triangular. For example, the protrusion 287 may include first to fourth protrusions 287a, 287b, 287c, and 287d, as shown in FIG. 1. The first protrusion 287a protruding from the first end (e.g., the left end) of the upper edge of the pixel area (P) may include a first edge extending from the first end of the upper edge of the pixel area (P) and a second edge extending from an inner portion of the upper edge of the pixel area (P). The first and second edges of the first protrusion 287a form, or substantially form a right-angled triangle with respect to the portion of the upper edge of the pixel area (P) between the first and second edges. The second protrusion 287b protruding from the second end (e.g., the right end) of the upper edge of the pixel area (P) may include a first edge extending from the second end of the upper edge of the pixel area (P) and a second edge extending from an inner portion of the upper edge of the pixel area (P). The first and second edges of the second protrusion 287b form, or substantially form a right-angled triangle with respect to the portion of the upper edge of the pixel area (P) between the first and second edges. The third protrusion 287c protruding from the first end (e.g., the left end) of the lower edge of the pixel area (P) may include a first edge extending from the first end of the lower edge of the pixel area (P) and a second edge extending from an inner portion of the lower edge of the pixel area (P). The first and second edges of the third protrusion 287c form, or substantially form a right-angled triangle with respect to the portion of the lower edge of the pixel area (P) between the first and second edges. The fourth protrusion 287d protruding from the second end (e.g., the right end) of the lower edge of the pixel area (P) may include a first edge extending from the second end of the lower edge of the pixel area (P) and a second edge extending from an inner portion of the lower edge of the pixel area (P). The first and second edges of the fourth protrusion 287d form, or substantially form a right-angled triangle with respect to the portion of the lower edge of the pixel area (P) between the first and second edges.

The second insulating layer 290 covers the upper surface and the side surface of the roof layer 285. As a result, the second insulating layer 290 may include the protrusion 287 protruding from the upper edge and the lower edge of the pixel area (P).

The liquid crystal molecules 3 formed in the space 200 are injected through the liquid crystal injection hole 201. The liquid crystal molecules 3 may be injected via a capillary phenomenon such that the a meniscus is formed near the liquid crystal injection hole 201.

When the liquid crystal injection hole 201 is formed as a straight line, and the meniscus has a shape that is concave towards the inside of the liquid crystal injection hole 201, a region where the liquid crystal molecules 3 do not exist may be generated at the edges of the pixel area (P), and light leakage may occur in the corresponding portion.

In an exemplary embodiment of the present invention, the common electrode 270 and the roof layer 285 include the protrusion 287 on both the upper edge and the lower edge of the pixel area (P). As a result, a portion of the liquid crystal injection hole 201 may be positioned outside of the pixel area (P) (e.g., beyond an outer periphery of the pixel area (P)). Accordingly, the meniscus is formed outside of the pixel area (P), and the liquid crystal molecules 3 may fill the entire pixel area, which may reduce or prevent light leakage.

An overcoat 295 may be formed on the second insulating layer 290. The overcoat 295 covers the liquid crystal injection hole 201 in an area corresponding to where the space 200 is exposed. That is, the overcoat 295 may seal the liquid crystal injection hole 201 such that the liquid crystal molecules 3 formed inside the space 200 does not flow outside the space. The overcoat 295 makes contact with the liquid crystal molecules 3 in the space 200. Thus, the overcoat 295 is made of a material that does not react with the liquid crystal molecules 3. For example, the overcoat 295 may be made of a material such as, for example, parylene. The overcoat 295 may be a thick organic layer, thereby flattening the surface of the substrate 110.

A first polarizer 12 may be formed under the substrate 110, and a second polarizer 22 may be further formed on the overcoat 295.

When the second polarizer 22 is formed on the overcoat 295, the second polarizer 22 may flatten the upper portion of the overcoat 295. Accordingly, a layer flattening the upper portion of the overcoat 295 may be further formed.

Figure 4:
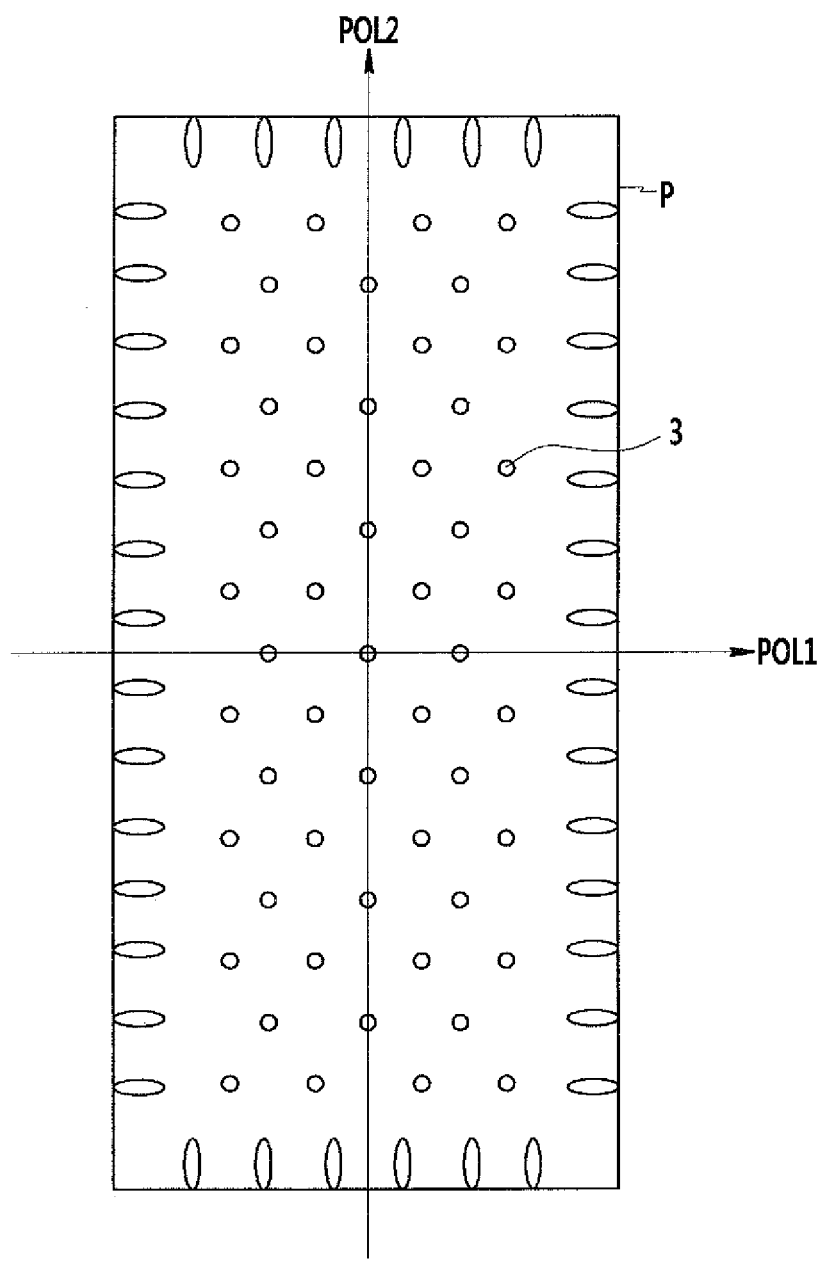
FIG. 4 is a top plan view of an initial alignment state of liquid crystal molecules of one pixel of a display device, according to an exemplary embodiment of the present invention.

Referring to FIG. 4, in an initial state in which an electric field is not applied to the liquid crystal molecules 3, the liquid crystal molecules 3 may be slanted in a direction perpendicular to, or substantially perpendicular to the edge of the pixel area (P) at the edge of the pixel area (P).

When the polarization axis POL1 of the first polarizer 12 and the polarization axis POL2 of the second polarizer 22 form an angle of about 45 degrees and about 135 degrees with one edge of the pixel area (P), a portion of the light passing through the first polarizer 12 is passed through the second polarizer 22 through the liquid crystal molecules 3 at the edge of the pixel area (P), potentially resulting in light leakage.

In an exemplary embodiment of the present invention, the polarization axis POL1 of the first polarizer 12 is parallel to, or substantially parallel to the upper edge and the lower edge of the pixel area (P), and the polarization axis POL2 of the second polarizer 22 is parallel to, or substantially parallel to the right edge and the left edge of the pixel area (P). As a result, at the edge of the pixel area (P), the light passing through the first polarizer 12 is not passed through the liquid crystal molecules 3, and light leakage may be reduced or prevented.

Alternatively, in an exemplary embodiment, the polarization axis POL1 of the first polarizer 12 may be parallel to the right edge and the left edge of the pixel area (P), and the polarization axis POL2 of the second polarizer 22 may be parallel to the upper edge and the lower edge of the pixel area (P).

In the exemplary embodiment described above, the color filter 230 is formed in the pixel area (P) and the light blocking member 220 is formed on the boundary of the pixel area (P), however exemplary embodiments of the present invention are not limited thereto. For example, in an exemplary embodiment, the light blocking member 220 may not be formed, and the color filter 230 formed in the neighboring pixel areas (P) may extend to the boundary of the pixel area (P) such that color filters 230 of two colors overlap each other. The color filters 230 overlapping each other at the boundary of the pixel area (P) may prevent light leakage.

In addition, in the exemplary embodiment described above, the color filter 230 and the light blocking member 220 are formed under the common electrode 270, however exemplary embodiments of the present invention are not limited thereto. For example, in an exemplary embodiment, the color filter 230 and the light blocking member 220 may be formed on the common electrode 270. Further, in an exemplary embodiment, the roof layer 285 is not formed, and the color filter 230 and the light blocking member 220 may include the function of the roof layer 285 as described above.

A display device according to an exemplary embodiment of the present invention will be described with reference to FIG. 5.

Figure 5:
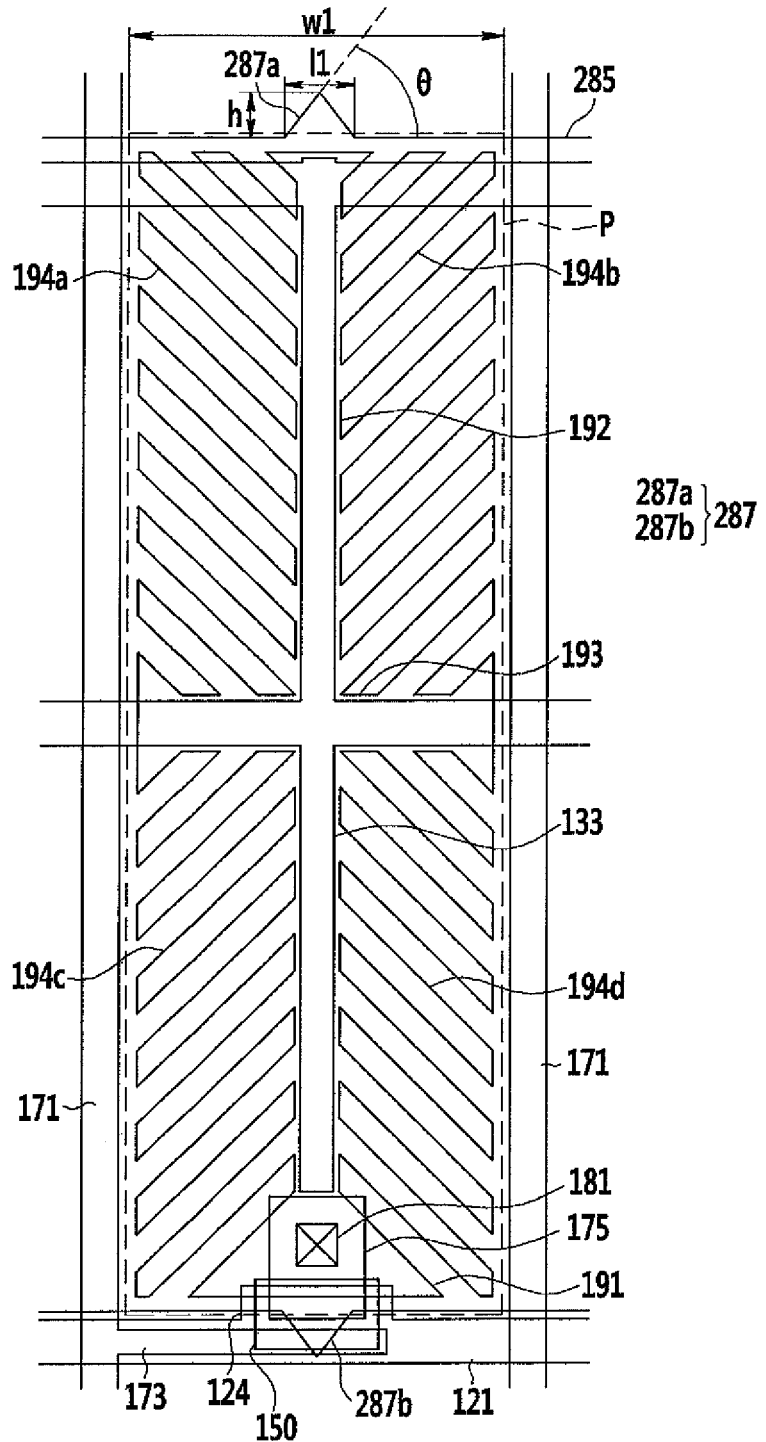
FIGS. 5-11 are top plan views of a display device, according to exemplary embodiments of the present invention.

The display device according to the exemplary embodiment shown in FIG. 5 is similar to the display device described with reference to FIG. 1. Thus, the description of certain similar elements may be omitted. The shape of the protrusion 287 described with reference to FIG. 5 is different from the shape of the protrusion 287 described with reference to FIG. 1.

FIG. 5 is a top plan view of a display device according to an exemplary embodiment of the present invention. The cross-sectional view of the display device according to the exemplary embodiment shown in FIG. 5 is similar to the cross-sectional view shown in FIGS. 2 and 3.

The elements of the display device according to the exemplary embodiment shown in FIG. 5 may be deposited in a similar sequence as described above with reference to FIGS. 1 to 3.

In an exemplary embodiment according to FIG. 5, the protrusion 287 protrudes from a center area of the upper edge and lower edge of the pixel area (P), rather than from the first and second ends (e.g., left and right ends) of the upper edge and lower edge of the pixel area (P).

The protrusion 287 includes first and second protrusions 287a and 287b. The first protrusion 287a protruding from the center area of the upper edge of the pixel area (P) may include two edges extending towards each other from the center area of the upper edge of the pixel area (P). The two edges meet each other outside of the pixel area (P), forming a triangular shape, and form a predetermined angle with respect to the portion of the upper edge of the pixel area (P) between the two edges. The second protrusion 287b protruding from the center area of the lower edge of the pixel area (P) may include two edges extending towards each other from the center area of the lower edge of the pixel area (P). The two edges meet each other outside of the pixel area (P), forming a triangular shape, and form a predetermined angle with respect to the portion of the lower edge of the pixel area (P) between the two edges.

A width w1 of the pixel area (P) may be varied according to the size and resolution of the display device. For example, the width w1 may be less than about 100 um.

The size of a length l1 of the portion of the upper edge of the pixel area (P) between the first and second edges of the first protrusion 287a controls the meniscus. The length l1 may be narrower than the width w1 of the pixel area (P). For example, in an exemplary embodiment, the length l1 of the first protrusion 287a may be at least about 5 um and at most about 100 um.

Further, in an exemplary embodiment, a height h of the first protrusion 287a may be at least about 5 um and at most about 30 um.

In addition, in an exemplary embodiment, the first edge (e.g., the left edge) of the first protrusion 287a may form an angle of at least about 10 degrees and at most about 80 degrees with the portion of the upper edge of the pixel area (P) between the first and second edges. When the first edge (e.g., the left edge) and the second edge (e.g., right edge) of the first protrusion 287a are symmetrical to each other, the second edge of the first protrusion 287a may also form an angle of at least about 10 degrees and at most about 80 degrees with the portion of the upper edge of the pixel area (P) between the first and second edges.

Exemplary embodiments of the present invention are not limited to the number of first and second protrusions 287a and 287b as shown in FIG. 5.

In an exemplary embodiment of the present invention, the common electrode 270 and the roof layer 285 include the protrusion 287 in the center area of the upper edge and the lower edge of the pixel area (P), such that a portion of the liquid crystal injection hole 201 may be positioned outside of the pixel area (P). Accordingly, the meniscus may be formed outside of the pixel area (P).

A display device according to exemplary embodiments of the present invention will be described with reference to FIGS. 6 and 7.

Figure 6:
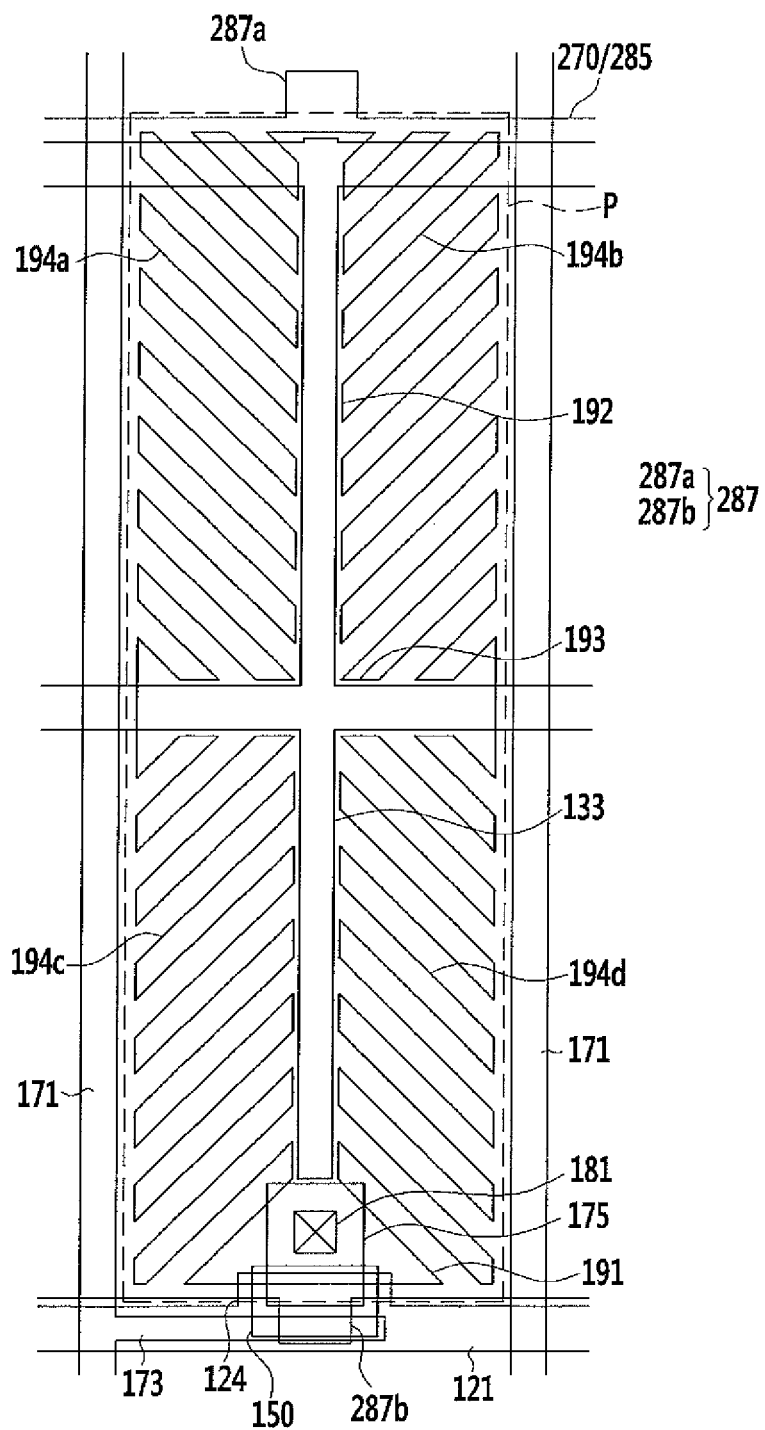

FIG. 6 is a top plan view of a display device according to an exemplary embodiment of the present invention. FIG. 7 is a top plan view of a display device according to an exemplary embodiment of the present invention.

Figure 7:
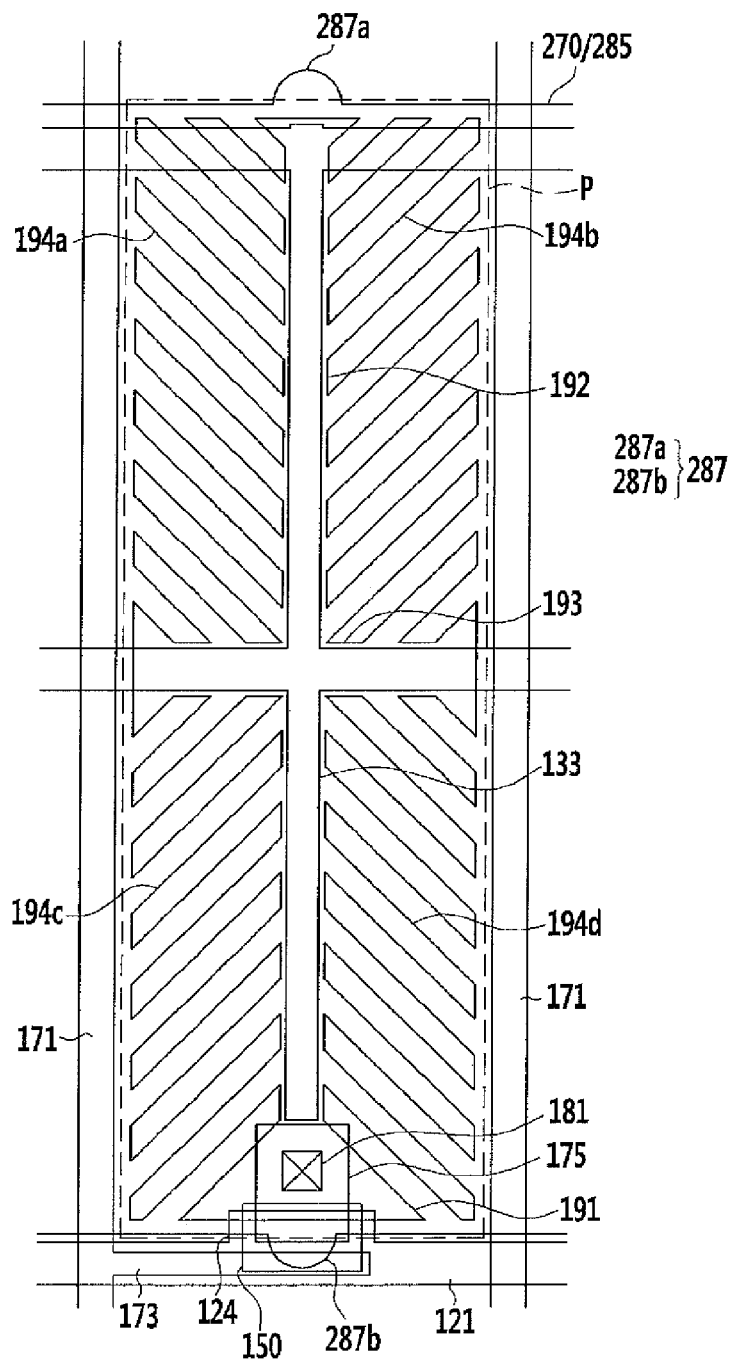

Referring to the exemplary embodiments according to FIGS. 6 and 7, the position of the protrusion 287 is similar to that of the exemplary embodiment according to FIG. 5, however the embodiments shown in FIGS. 6 and 7 include a protrusion 287 having different shapes.

As shown in FIGS. 6 and 7, the common electrode 270 and the roof layer 285 include a protrusion 287 protruding from a center area of the upper edge and the lower edge of the pixel area (P).

The protrusion 287 may be substantially in the shape of a quadrangle. For example, the protrusion 287 may include a first protrusion 287a and a second protrusion 287b, each substantially having the shape of a quadrangle. The first protrusion 287a protruding from the center area of the upper edge of the pixel area (P) may include two edges extending from, and perpendicular to, or substantially perpendicular to the upper edge of the pixel area (P), as shown in FIG. 6. The second protrusion 287b protruding from the center area of the lower edge of the pixel area (P) may include two edges extending from, and perpendicular to, or substantially perpendicular to the lower edge of the pixel area (P), as shown in FIG. 6.

The width and the height of the protrusion 287 in the exemplary embodiment shown in FIG. 6 may have values in the range described with reference to the protrusion of the exemplary embodiment described with reference to FIG. 5.

Referring to FIG. 7, the shape of the protrusion 287 of the display device according to an exemplary embodiment may be circular. For example, the protrusion 287 may include the first protrusion 287a and the second protrusion 287b, as shown in FIG. 7. The first protrusion 287a may be circular and may protrude from a center area of the upper edge of the pixel area (P). The second protrusion 287b may be circular and may protrude from the center area of the lower edge of the pixel area (P).

The diameter of the protrusion 287 in the exemplary embodiment shown in FIG. 7 may have values in the range described with reference to the protrusion of the exemplary embodiment described with reference to FIG. 5.

According to the exemplary embodiments described above, the shape of the protrusion 287 may be a triangle, a quadrangle, or circular, however exemplary embodiments of the present invention are not limited thereto. For example, exemplary embodiments may include a protrusion 287 having other shapes such as a trapezoid.

A display device according to an exemplary embodiment of the present invention will be described with reference to FIG. 8.

Figure 8:
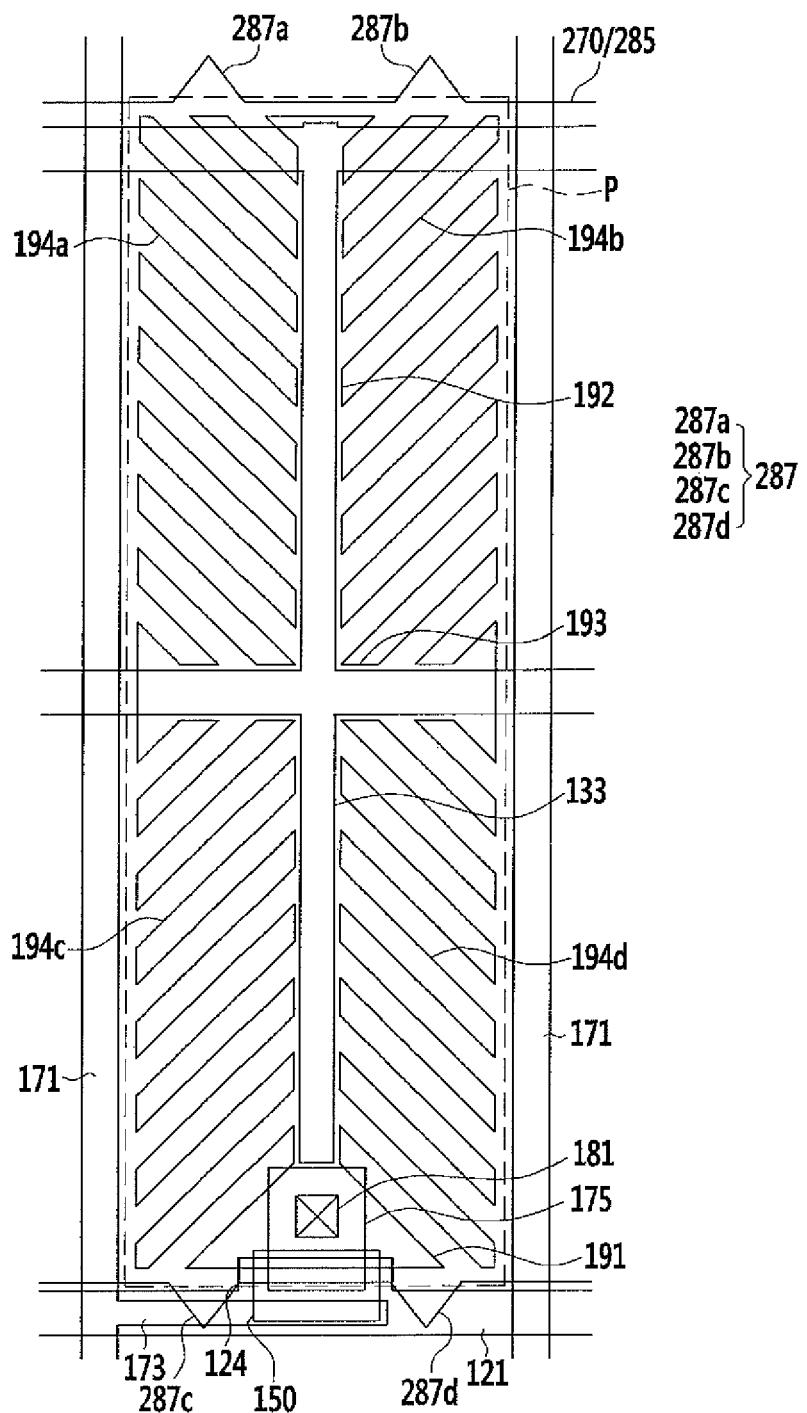

FIG. 8 is a top plan view of a display device according to an exemplary embodiment of the present invention.

In the display device according to the exemplary embodiment shown in FIG. 8, the common electrode 270 and the roof layer 285 include a protrusion 287 protruding from the upper edge and the lower edge of the pixel area (P).

The protrusion 287 includes first to fourth protrusions 287a, 287b, 287c, and 287d, each having a triangular shape. The first protrusion 287a protrudes between a center area of the upper edge of the pixel area (P) and a first end (e.g., the left end) of the pixel area (P), the second protrusion 287b protrudes between the center area of the upper edge of the pixel area (P) and a second end (e.g., the right end) of the pixel area (P), the third protrusion 287c protrudes between a center area of the lower edge of the pixel area (P) and the first end of the pixel area (P), and the fourth protrusion 287d protrudes between the center area of the lower edge of the pixel area (P) and the second end of the pixel area (P).

The protrusion 287 shown in FIG. 8 includes four triangular protrusions, however exemplary embodiments of the present invention are not limited thereto. For example, exemplary embodiments may include more than four triangular protrusions, or less than four triangular protrusions. In an exemplary embodiment, two protrusions may be formed between the center area of the upper edge of the pixel area (P) and the first end of the pixel area (P), and two protrusions may be formed between the center area of the upper edge of the pixel area (P) and the second end of the pixel area (P). The same configuration may be included at the lower edge of the pixel area (P), thereby resulting in a total of eight triangular protrusions.

Further, exemplary embodiments according to FIG. 8 may include shapes other than triangles. For example, the protrusions may be in the shape of a quadrangle or a trapezoid, or may be circular.

A display device according to an exemplary embodiment of the present invention will be described with reference to FIG. 9.

Figure 9:
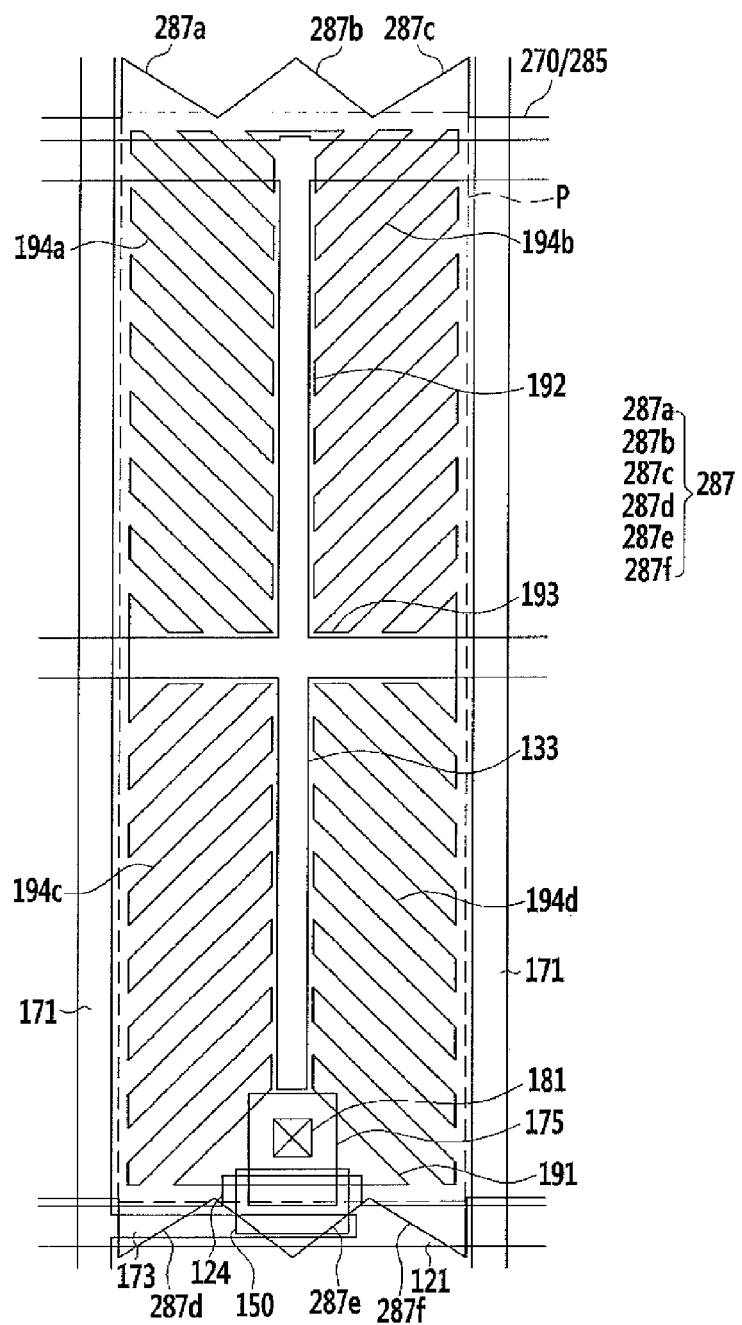

FIG. 9 is a top plan view of a display device according to an exemplary embodiment of the present invention.

In the display device according to the exemplary embodiment shown in FIG. 9, the common electrode 270 and the roof layer 285 include a protrusion 287 protruding from the upper edge and the lower edge of the pixel area (P).

The protrusion 287 includes first to sixth triangular protrusions 287a, 287b, 287c, 287d, 287e, and 287f. The first to third triangular protrusions 287a, 287b, and 287c include vertexes meeting each other at the upper edge of the pixel area (P), and the fourth to sixth protrusions 287d, 287e, and 287f include vertexes meeting each other at the lower edge of the pixel area (P).

The first protrusion 287a may include a first edge extending from the first end (e.g., the left end) of the upper edge of the pixel area (P) and a second edge extending from an inner portion of the upper edge of the pixel area (P). The first and second edges of the first protrusion 287a form, or substantially form a right-angled triangle with respect to the portion of the upper edge of the pixel area (P) between the first and second edges. The second protrusion 287b protrudes from the upper edge of the pixel area (P) to the outside of the pixel area (P), as shown in FIG. 9. The third protrusion 287c may include a first edge extending from the second end (e.g., the right end) of the upper edge of the pixel area (P) and a second edge extending from an inner portion of the upper edge of the pixel area (P). The first and second edges of the third protrusion 287c form, or substantially form a right-angled triangle with respect to the portion of the upper edge of the pixel area (P) between the first and second edges.

The second protrusion 287b is positioned between the first protrusion 287a and the third protrusion 287c, and the vertexes of the second protrusion 287b meet the vertex of the first protrusion 287a and the vertex of the third protrusion 287c at the upper edge of the pixel area (P), as shown in FIG. 9.

The fourth protrusion 287d may include a first edge extending from the first end (e.g., the left end) of the lower edge of the pixel area (P) and a second edge extending from an inner portion of the lower edge of the pixel area (P). The first and second edges of the fourth protrusion 287d form, or substantially form a right-angled triangle with respect to the portion of the lower edge of the pixel area (P) between the first and second edges. The fifth protrusion 287e protrudes from the lower edge of the pixel area (P) outside of the pixel area (P). The sixth protrusion 287f may include a first edge extending from the second end (e.g., the right end) of the pixel area (P) and a second edge extending from an inner portion of the lower edge of the pixel area (P). The first and second edges of the sixth protrusion 287f form, or substantially form a right-angled triangle with respect to the portion of the lower edge of the pixel area (P) between the first and second edges.

The fifth protrusion 287e is positioned between the fourth protrusion 287d and the sixth protrusion 287f, and the vertexes of the fifth protrusion 287e meet the vertex of the fourth protrusion 287d and the vertex of the sixth protrusion 287f at the lower edge of the pixel area (P), as shown in FIG. 9.

The protrusion 287 shown in FIG. 9 includes three triangular protrusions having vertexes that meet each other at the upper edge of the pixel area (P), and three triangular protrusions having vertexes that meet each other at the lower edge of the pixel area (P), however exemplary embodiments of the present invention are not limited thereto. For example, in an exemplary embodiment, the protrusion 287 may include three additional triangular protrusions having vertexes that meet each other at the upper edge of the pixel area (P), and three additional triangular protrusions having vertexes that meet each other at the lower edge of the pixel area (P), thereby resulting in a total of 12 triangular protrusions.

A display device according to an exemplary embodiment of the present invention will be described with reference to FIG. 10

Figure 10:
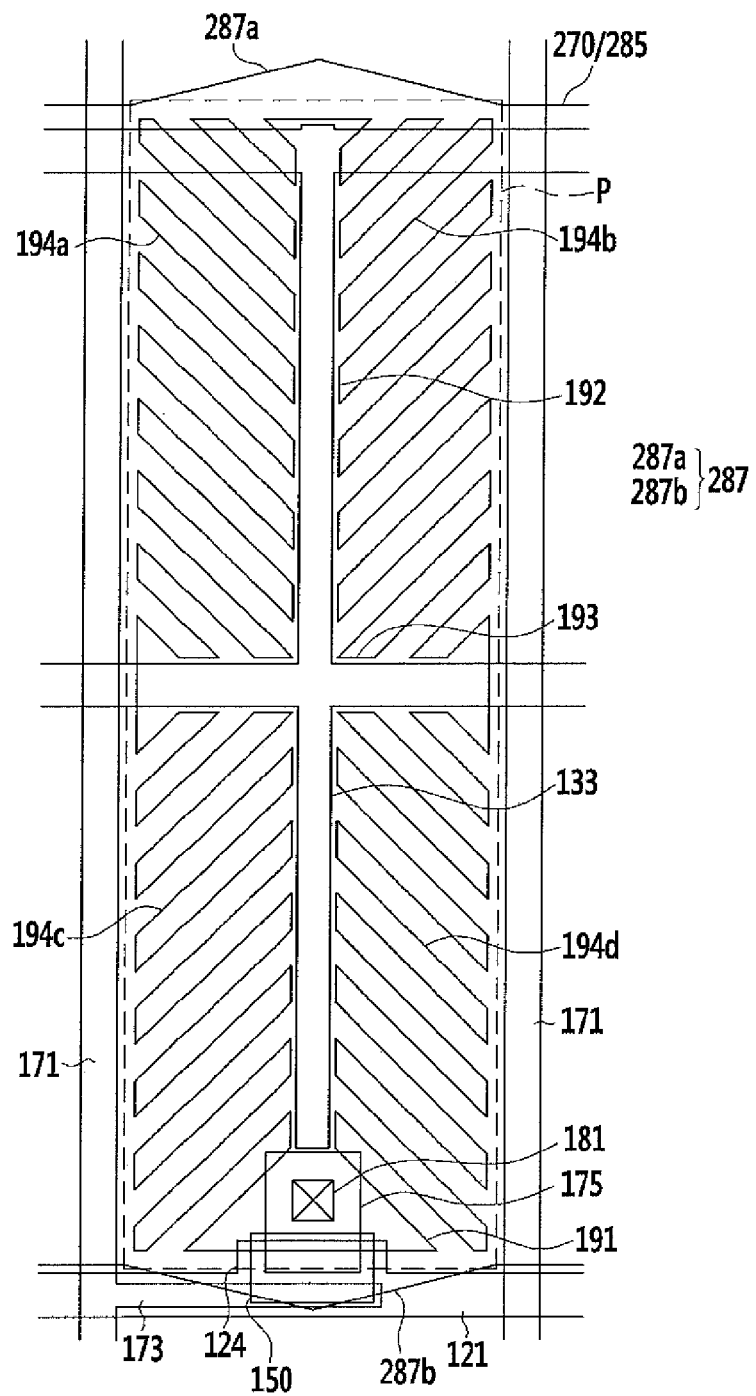

FIG. 10 is a top plan view of a display device according to an exemplary embodiment of the present invention.

In the display device according to the exemplary embodiment shown in FIG. 10, the common electrode 270 and the roof layer 285 include a protrusion 287 protruding from the upper edge and the lower edge of the pixel area (P).

The protrusion 287 includes the first and second triangular protrusions 287a and 287b. Referring to the first protrusion 287a, the distance of the protrusion from the upper edge of the pixel area (P) is gradually increased as the protrusion gets closer to a center area from the first and second ends (e.g., the left and right ends) of the upper edge of the pixel area (P). Referring to the second protrusion 287b, the distance of the protrusion from the lower edge of the pixel area (P) is gradually increased as the protrusion length gets closer to a center area from the first and second ends (e.g., the left and right ends) of the lower edge of the pixel area (P).

A display device according to an exemplary embodiment of the present invention will be described with reference to FIG. 11.

Figure 11:
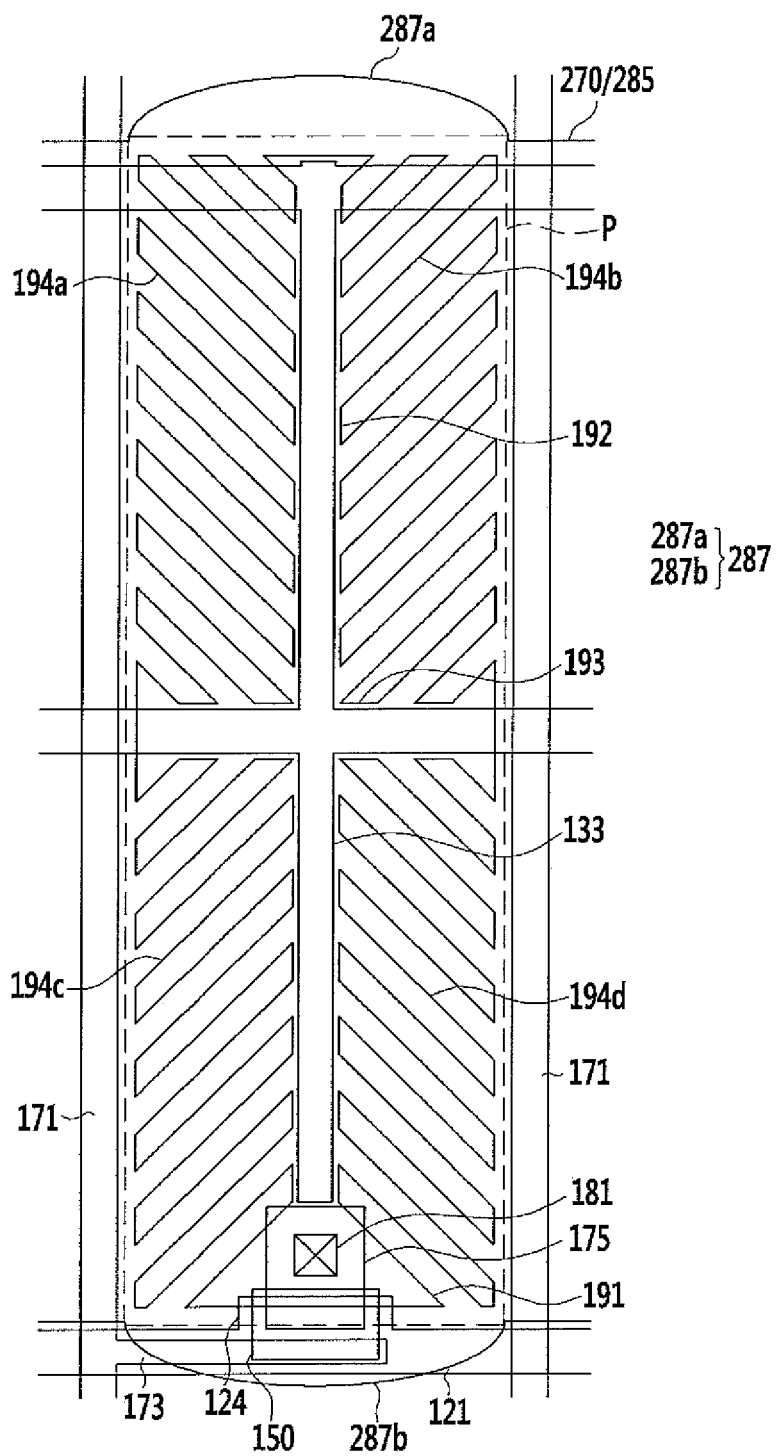

FIG. 11 is a top plan view of a display device according to an exemplary embodiment of the present invention.

The protrusion 287 shown in FIG. 11 includes a first protrusion 287a of which the distance of the protrusion 287a from the upper edge of the pixel area (P) is gradually increased as the protrusion 287a gets closer to a center area from the first and second ends (e.g., the left and right ends) of the upper edge of the pixel area (P), and a second protrusion 287b of which the distance of the protrusion 287b from the lower edge of the pixel area (P) is gradually increased as the protrusion 287b gets closer to a center area from the first and second ends (e.g., the left and right ends) of the lower edge of the pixel area (P), similar to the exemplary embodiment shown in FIG. 10. However, in the exemplary embodiment shown in FIG. 11, in the first and second protrusions 287a and 287b have a circular shape. That is, in the exemplary embodiment shown in FIG. 10, the relationship between the distance from the edge of the pixel area (P) to the center and the protrusion is linear, and in the exemplary embodiment shown in FIG. 11, the relationship between the distance from the edge of the pixel area (P) to the center area and the protrusion is non-linear.

A manufacturing method of a display device according to an exemplary embodiment of the present invention will be described with reference to FIGS. 12 to 23.

The manufacturing method described with reference to FIGS. 12 to 23 may be used to manufacture the exemplary embodiments described above. Although the manufacturing method described with reference to FIGS. 12 to 23 illustrates the manufacture of the display device according to the exemplary embodiment shown in FIG. 1, the manufacturing method is not limited thereto, and may be utilized to manufacture the display device according to all of the exemplary embodiments described above. That is, the manufacturing method may be utilized to manufacture display devices including different numbers of protrusions, and protrusions having different sizes and shapes. The number of protrusions, and the sizes and shapes of the protrusions may be adjusted by changing the shape of the mask used in the manufacturing method.

FIGS. 12, 14, 16, 18, 20, and 22 are processing plan views of a manufacturing method of a display device, according to an exemplary embodiment of the present invention. FIGS. 13, 15, 17, 19, 21, and 23 are processing cross-sectional views of a manufacturing method of a display device, taken along the lines X-X, XI-XI, XII-XII, XIII-XIII, XIV-XIV, and XV, shown in FIGS. 12, 14, 16, 18, 20, and 22, respectively, according to an exemplary embodiment of the present invention.

Figure 12:
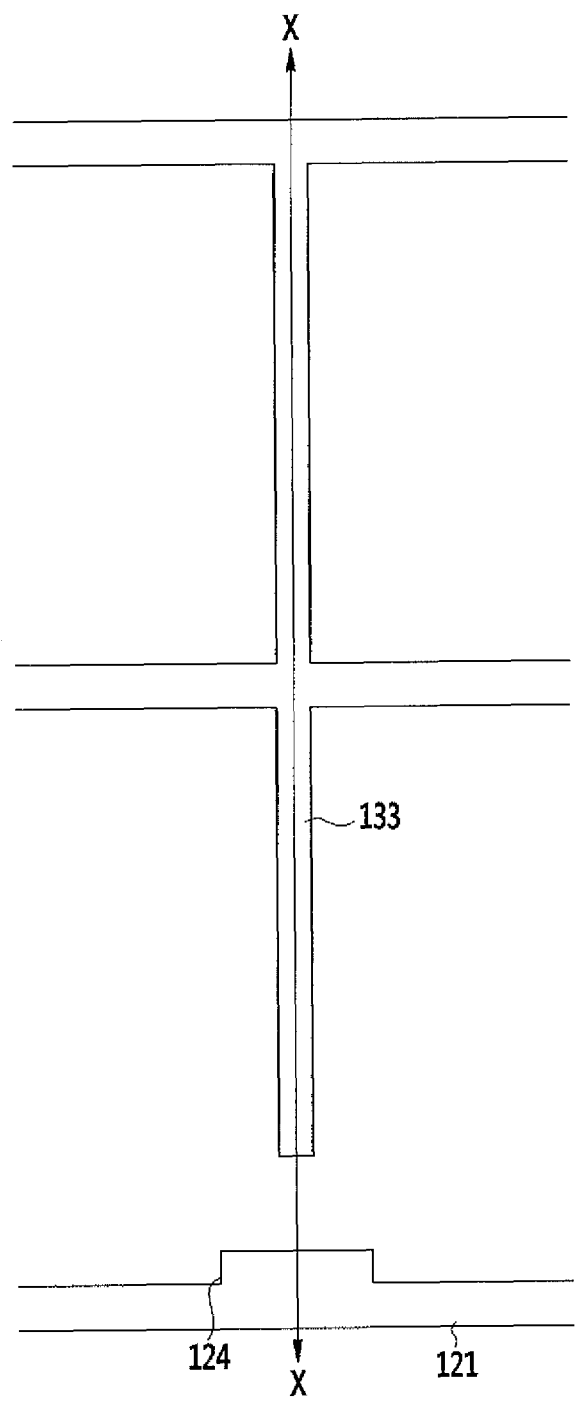
FIGS. 12, 14, 16, 18, 20, and 22 are processing plan views of a manufacturing method of a display device, according to an exemplary embodiment of the present invention.
Figure 13:
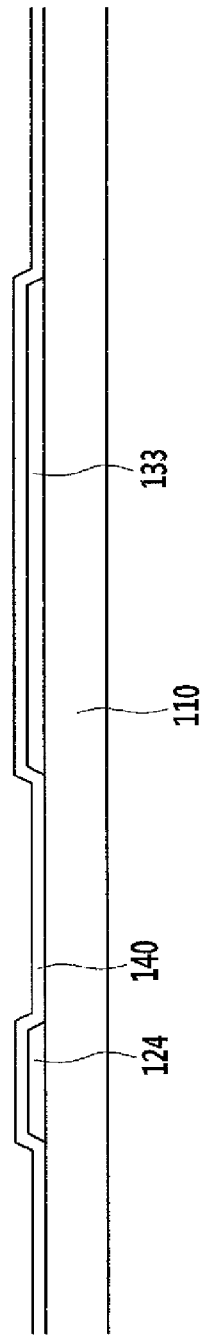
FIGS. 13, 15, 17, 19, 21, and 23 are processing cross-sectional views of a manufacturing method of a display device, according to an exemplary embodiment of the present invention.

As shown in FIGS. 12 and 13, a gate line 121 extending in one direction and a gate electrode 124 protruding from the gate line 121 are formed on a substrate 110 may be made of, for example, glass or plastic. In addition, a storage electrode 133 separated from the gate line 121 and the gate electrode 124 is formed. The storage electrode 133 may be formed using the same material as the gate line 121 and the gate electrode 124.

Next, a gate insulating layer 140 made of an inorganic insulating material such as, for example, silicon oxide or silicon nitride, is formed on an entire surface of the substrate 110 including the gate line 121, the gate electrode 124, and the storage electrode 133, as shown in FIG. 13. The gate insulating layer 140 may be a single layer or a multilayer.

Figure 14:
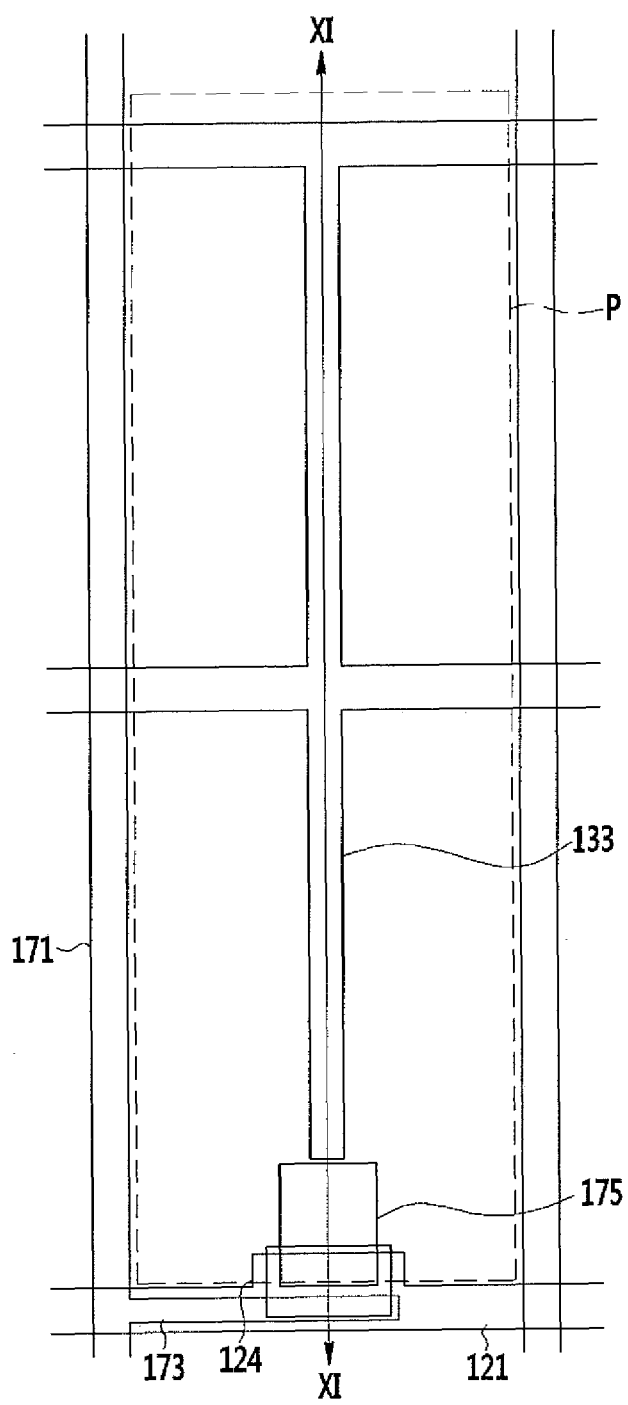
Figure 15:
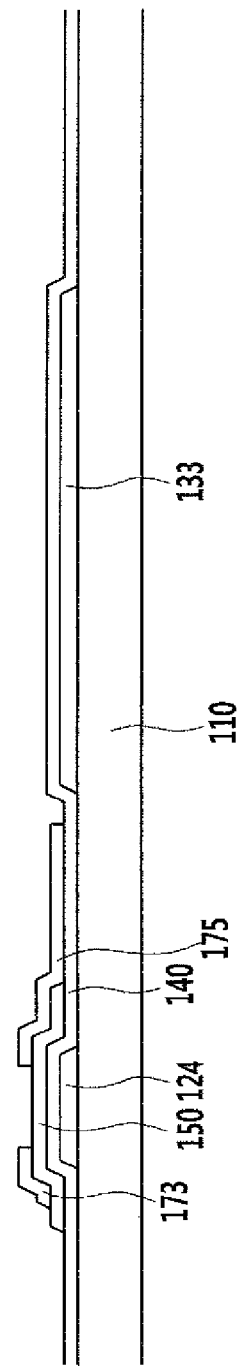

As shown in FIGS. 14 and 15, a semiconductor material such as, for example, amorphous silicon, polycrystalline silicon, or a metal oxide, is deposited on the gate insulating layer 140 and patterned to form a semiconductor layer 150. The semiconductor layer 150 may be positioned on the gate electrode 124.

Next, a metal material is deposited and patterned to form a data line 171 extending in the other direction. Also, a source electrode 173 protruding from the data line 171 on the semiconductor layer 150, and a drain electrode 175 separated from the source electrode 173 are formed. The metal material may be a single layer or a multilayer.

After forming the semiconductor layer 150 by patterning the semiconductor material, the data line 171, the source electrode 173, and the drain electrode 175 are formed by depositing and patterning the metal material, however exemplary embodiments of the present invention are not limited thereto.

That is, the semiconductor material and the metal material may be continuously deposited and simultaneously patterned to form the semiconductor layer 150, the data line 171, the source electrode 173, and the drain electrode 175. The semiconductor layer 150 extend under the data line 171.

The gate electrode 124, the semiconductor layer 150, the source electrode 173, and the drain electrode 175 form one thin-film transistor. The gate line 121 and the data line 171 may be crossed, and a plurality of pixel areas (P) may be defined by the gate line 121 and the data line 171.

Figure 16:
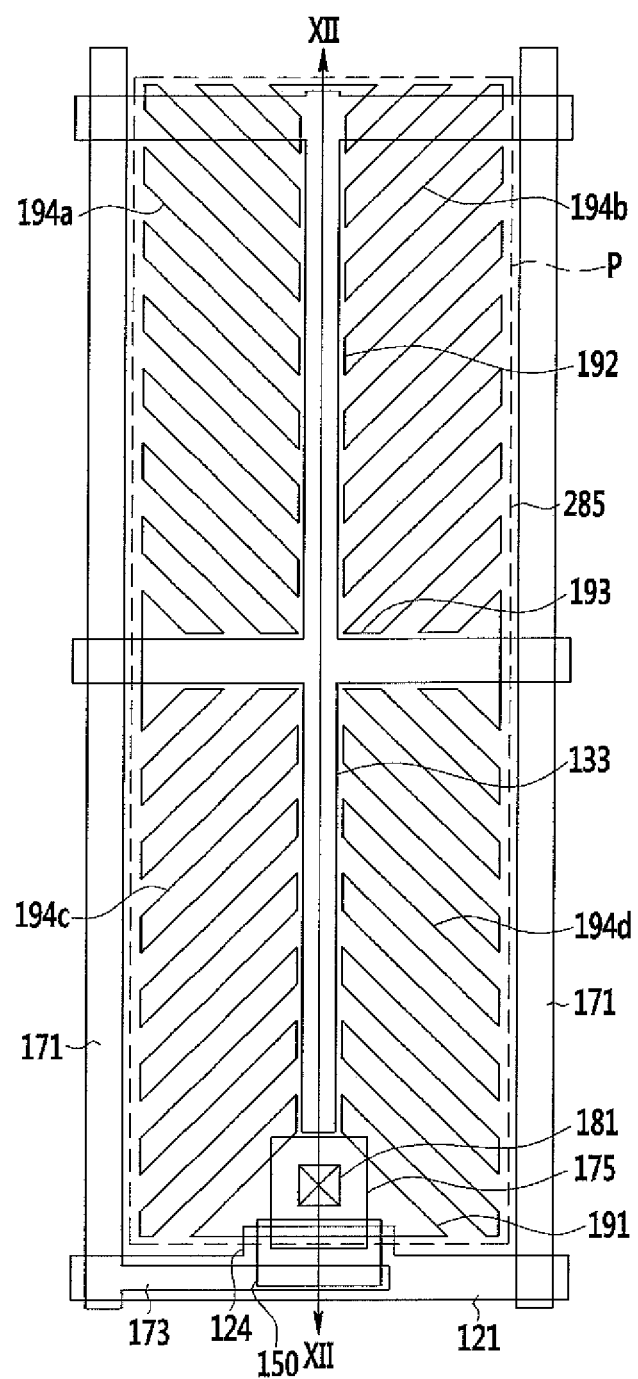
Figure 17:
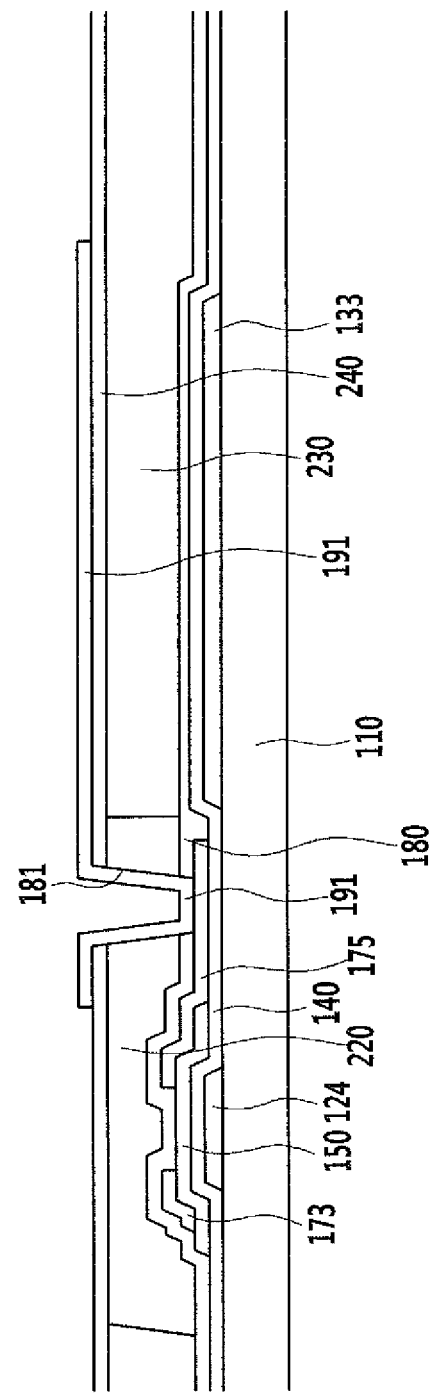

As shown in FIGS. 16 and 17, a passivation layer 180 is formed on the data line 171, the source electrode 173, the drain electrode 175, and the semiconductor layer 150 exposed between the source electrode 173 and the drain electrode 173. The passivation layer 180 may be made of, for example, an organic insulating material or an inorganic insulating material, and may be a single layer or a multilayer.

Next, a color filter 230 is formed in each pixel area (P) on the passivation layer 180. The color filters 230 of the same color may be formed according to the column direction of a plurality of pixel areas (P). For example, when forming the color filter 230 of three colors, the color filter 230 of the first color is first formed, and then the color filter 230 of the second color is formed by shifting a mask. Next, after forming the color filter 230 of the second color, the color filter 230 of the third color may be formed by shifting the mask again.

Next, a light blocking member 220 is formed on the thin-film transistor and the boundary of each pixel area (P) on the passivation layer 180.

According to exemplary embodiments of the present invention, the light blocking member 220 may be formed either before or after the formation of the color filter 230.

Next, the first insulating layer 240, which may be made of, for example, an inorganic insulating material such as silicon nitride (SiNx) or silicon oxide (SiOx), is formed on the color filter 230 and the light blocking member 220.

The first insulating layer 240, the light blocking member 220, and the passivation layer 180 are then etched to form a contact hole 181 exposing a portion of the drain electrode 175.

Next, a transparent metal material such as, for example, indium-tin oxide (ITO) or indium-zinc oxide (IZO), is deposited and patterned on the first insulating layer 240 to form a pixel electrode 191 in the pixel area (P). The pixel electrode 191 is connected to the drain electrode 175 through the contact hole 181.

Figure 18:
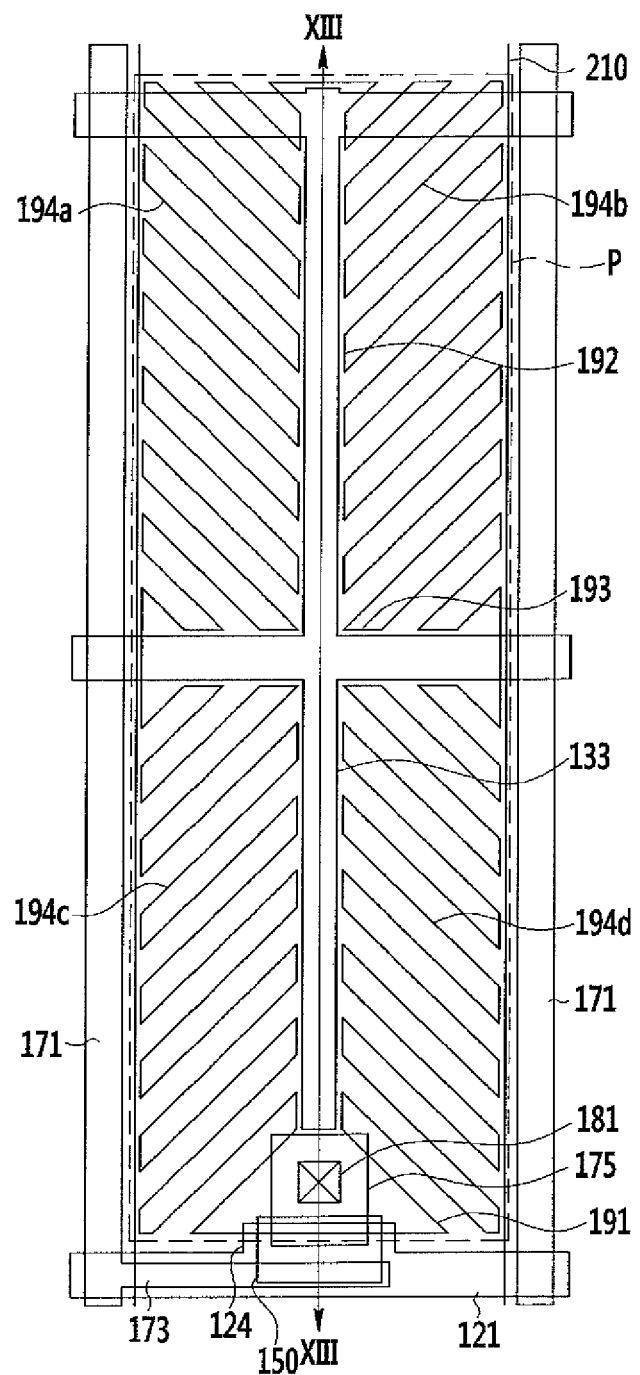
Figure 19:
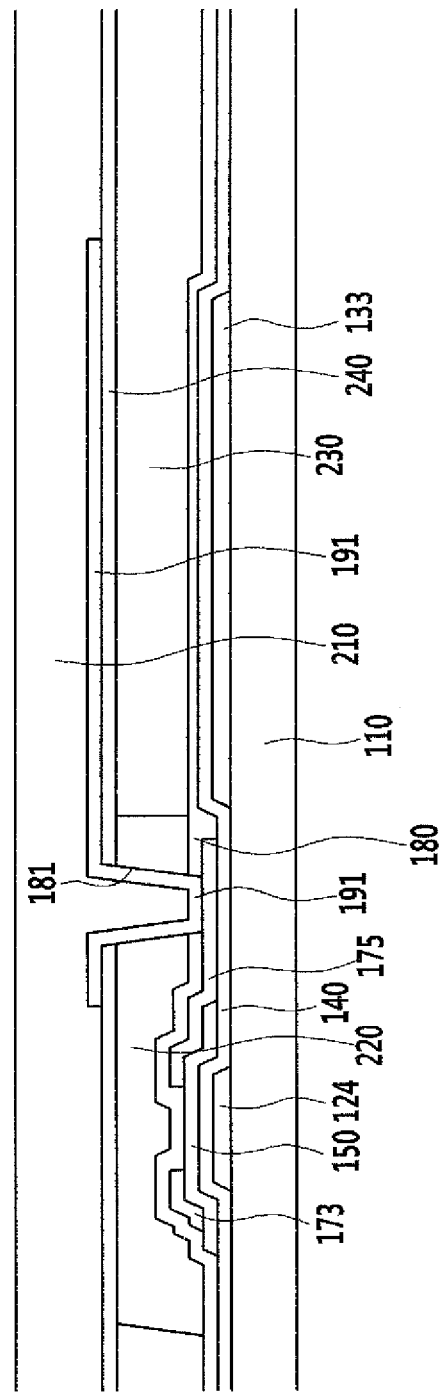

As shown in FIG. 18 and FIG. 19, a sacrificial layer 210 made of an organic insulating material is formed on the pixel electrode 191 and the first insulating layer 240. The sacrificial layer 210 is patterned to be divided between the pixel areas (P) in one direction, and to be connected according to the pixel areas (P) neighboring in the other direction. For example, the sacrificial layer 210 may be separated between the pixel areas (P) neighboring in the row direction, and may be connected according to the pixel areas (P) neighboring in the column direction. The sacrificial layer 210 formed on the data line 171 may be removed.

The sacrificial layer 210 may be made of for example, a photosensitive polymer material, and the sacrificial layer 210 may be patterned by performing a photo-process.

Figure 20:
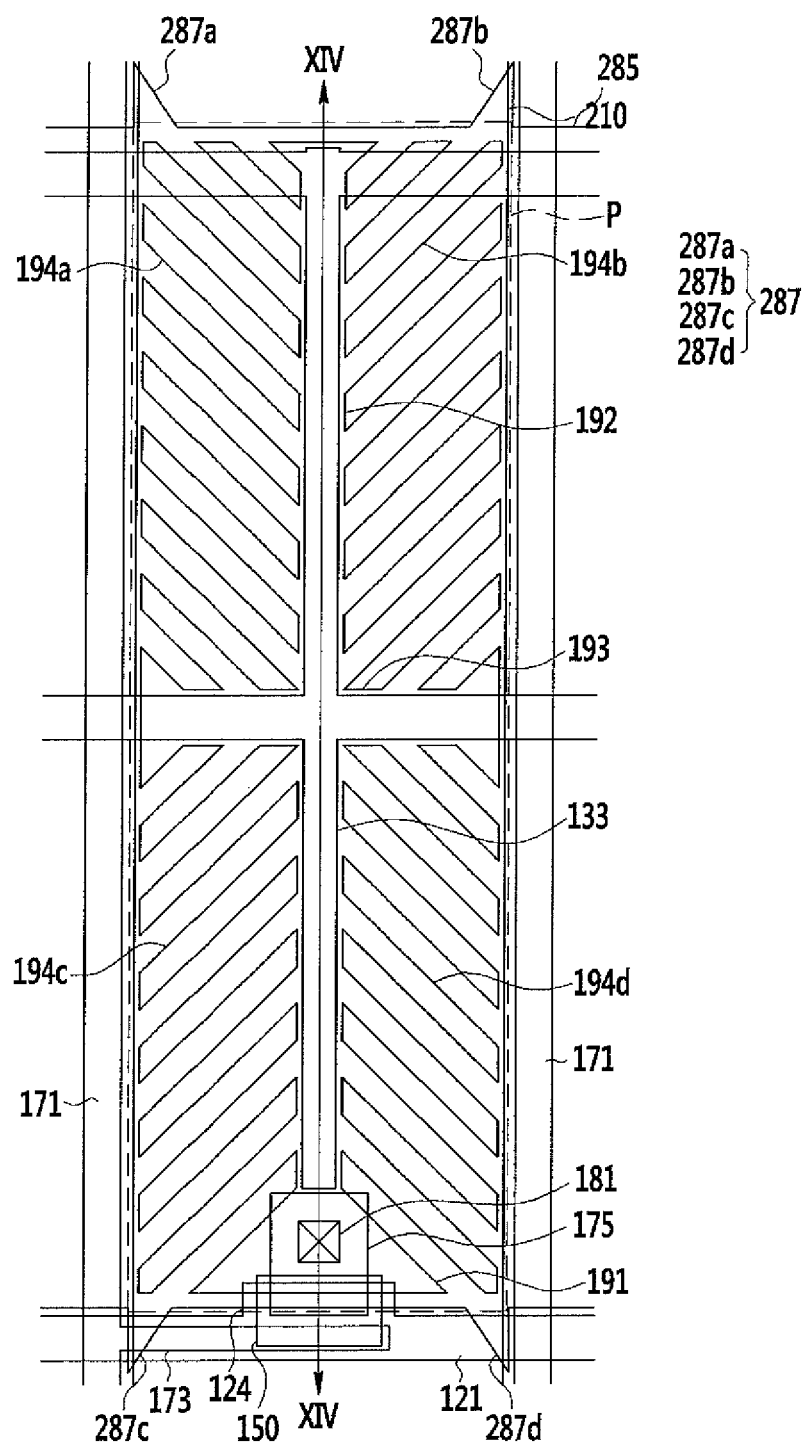
Figure 21:
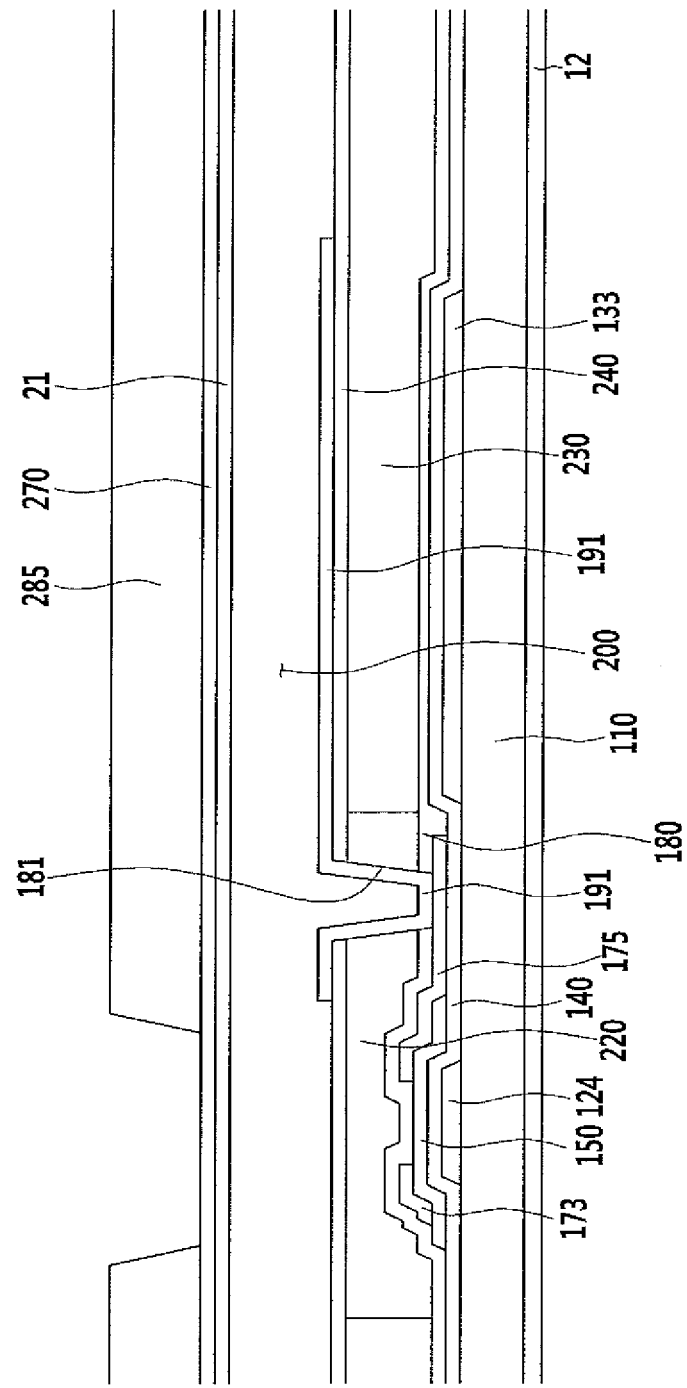

As shown in FIGS. 20 and 21, a metal material is deposited on the sacrificial layer 210 to form a common electrode 270. At this time, the common electrode 270 covers the entire surface of the substrate 110.

Next, a roof layer 285 made of an organic material is formed on the common electrode 270. The roof layer 285 is patterned to remove the roof layer 285 positioned between the pixel areas (P) neighboring in the column direction, such that the roof layer 285 is connected according to the pixel areas (P) neighboring in the row direction. Further, the roof layer 285 is patterned to include a protrusion 287 protruding from the upper edge and the lower edge of the pixel area (P).

At this time, the protrusion 287 is formed to include four triangular protrusions protruding from the first and second ends (e.g., the left and right ends) of the upper edge of the pixel area (P) and the first and second ends (e.g., the left and right ends) of the lower edge of the pixel area (P), as shown in FIG. 20. That is, the protrusion 287 may include first to fourth protrusions 287a, 287b, 287c, and 287d. The first protrusion 287a protruding from the first end (e.g., the left end) of the upper edge of the pixel area (P) may include a first edge extending from the first end of the upper edge of the pixel area (P), and a second edge extending from an inner portion of the upper edge of the pixel area (P). The first and second edges of the first protrusion 287a form, or substantially form a right-angled triangle with respect to the portion of the upper edge of the pixel area (P) between the first and second edges. The second protrusion 287b protruding from the second end of the upper edge of the pixel area (P) may include a first edge extending from the second end of the upper edge of the pixel area (P), and a second edge extending from an inner portion of the upper edge of the pixel area (P). The first and second edges of the second protrusion 287b form, or substantially form a right-angled triangle with respect to the portion of the upper edge of the pixel area (P) between the first and second edges. The third protrusion 287c protruding from the first end of the lower edge of the pixel area (P) may include a first edge extending from the first end of the lower edge of the pixel area (P), and a second edge extending from an inner portion of the lower edge of the pixel area (P). The first and second edges of the third protrusion 287c form, or substantially form a right-angled triangle with respect to the portion of the lower edge of the pixel area (P) between the first and second edges. The fourth protrusion 287d protruding from the second end of the lower edge of the pixel area (P) may include a first edge extending from the second end of the pixel area (P), and a second edge extending from an inner portion of the lower edge of the pixel area (P). The first and second edges of the fourth protrusion 287d form, or substantially form a right-angled triangle with respect to the portion of the lower edge of the pixel area (P) between the first and second edges.

Figure 22:
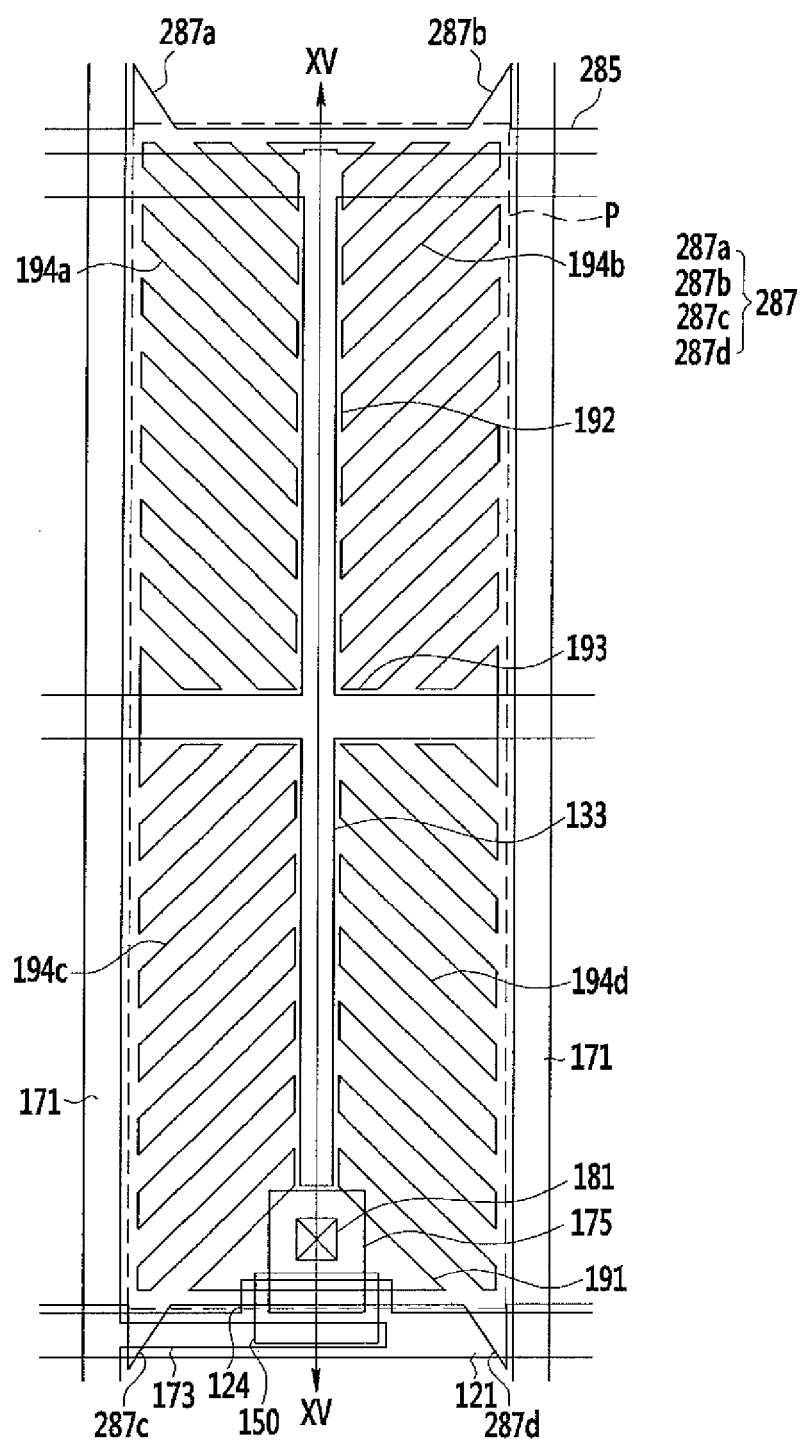
Figure 23:
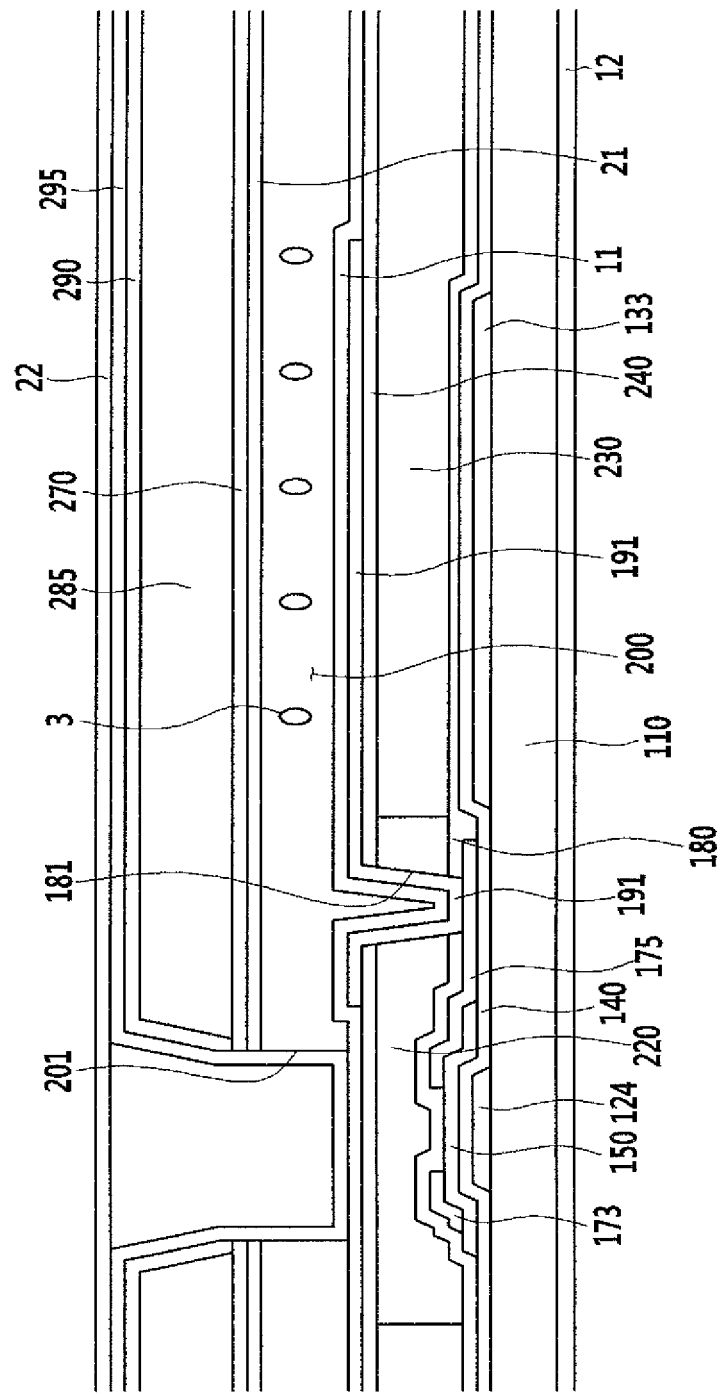

As shown in FIGS. 22 and 23, the second insulating layer 290, which is made of an inorganic insulating material such as, for example, silicon nitride (SiNx) or silicon oxide (SiOx), may be formed on the roof layer 285.

Next, the second insulating layer 290 and the common electrode 270 are patterned to remove the common electrode 270 and the second insulating layer 290 positioned between the pixel areas (P) neighboring in the column direction. As a result, the common electrode 270 is connected according to the pixel areas (P) neighboring in the row direction. In addition, the common electrode 270 is formed to include a protrusion 287 protruding from the upper edge and the lower edge of the pixel area (P).

The mask used for patterning the roof layer 285 and the mask used for patterning the common electrode 270 may be the same mask. As a result, the roof layer 285 and the common electrode 270 may have substantially the same shape. However, as shown in FIG. 23, the second insulating layer 290 may cover the side surface of the roof layer 285 such that the common electrode 270 has a boundary positioned outside of the roof layer 285.

The common electrode 270 is patterned to include first to fourth protrusions 287a, 287b, 287c, and 287d protruding from the upper edge and the lower edge of the pixel area (P), as shown in FIG. 22.

The sacrificial layer 210 positioned under a portion where the common electrode 270 is removed is exposed. In exemplary embodiments, oxygen plasma for ashing is supplied on the substrate 110 where the sacrificial layer 210 is exposed, or a developing solution is supplied to remove the entire surface of the sacrificial layer 210. If the sacrificial layer 210 is removed, a space 200 is created at a position where the sacrificial layer 210 is positioned. That is, the pixel electrode 191 and the common electrode 270 are separated with the space 200 interposed therebetween.

Further, the space 200 is exposed through a portion where the common electrode 270 and the roof layer 285 are not formed. This area is referred to as a liquid crystal injection hole 201. The liquid crystal injection hole 201 may be formed according to the direction of the gate line 121. Alternatively, in an exemplary embodiment, the liquid crystal injection hole 201 may be formed according to the direction of the data line 171.

In an exemplary embodiment, the liquid crystal injection hole 201 is positioned closer to the upper edge and the lower edge of the pixel area (P), and the common electrode 270 and the roof layer 285 include the protrusion 287 such that a portion of the liquid crystal injection hole 201 is positioned outside of the pixel area (P) (e.g., beyond an outer periphery of the pixel area (P)). That is, at the left and right ends of the upper edge and lower edge of the pixel area (P), the liquid crystal injection hole 201 is positioned outside the pixel area (P), and as a result, the meniscus of the liquid crystal layer is formed outside of the pixel area (P).

Next, an aligning agent including an alignment material is deposited on the substrate 110 using, for example, a spin coating method or an inkjet method, to inject the aligning agent inside the space 200 through the liquid crystal injection hole 201. After injecting the aligning agent inside the space 200, a hardening process is performed to evaporate a solution component and to maintain the alignment material on the inner wall of the space 200.

Accordingly, the first alignment layer 11 may be formed on the pixel electrode 191, and the second alignment layer 21 may be formed under the common electrode 270. The first alignment layer 11 and the second alignment layer 21 are formed such that they face to each other via the space 200, and are connected to each other at the edge of the pixel area (P). That is, the common electrode 270 forms a side wall covering the side surface of the space 200 in the direction parallel to the data line 171 in the portion near the data line 171, and the alignment material is maintained on the inner surface of the side wall.

At this time, the first and second alignment layers 11 and 21 perform alignment in the direction perpendicular to the first substrate 110, except for the side surface of the space 200. In addition, by performing a process of irradiating ultraviolet rays to the first and second alignment layer 11 and 21, alignment may be performed in the direction parallel to the substrate 110.

Next, liquid crystal molecules 3 are deposited by the inkjet method or the dispensing method on the substrate 110 such that the liquid crystal molecules 3 are injected inside the space 200 through the liquid crystal injection hole 201. At this time, the liquid crystal molecules 3 may be deposited via the liquid crystal injection hole 201 formed according to the odd-numbered gate lines 121, and may not be deposited via the liquid crystal injection hole 201 formed according to the even-numbered gate lines 121. Alternatively, the liquid crystal molecules 3 may be deposited via the liquid crystal injection hole 201 formed according to the even-numbered gate lines 121, and may not be deposited via the liquid crystal injection hole 201 formed according to the odd-numbered gate lines 121.

If the liquid crystal molecules 3 are deposited via the liquid crystal injection hole 201 formed according to the odd-numbered gate lines 121, the liquid crystal molecules 3 may be injected inside the space 200 through the liquid crystal injection hole 201 by capillary force. At this time, air inside the space 200 flows out through the liquid crystal injection hole 201 formed according to the even-numbered gate lines 121, allowing the liquid crystal molecules 3 to be injected inside the space 200.

Next, a material that does not react with the liquid crystal molecules 3 is deposited on the second insulating layer 290 to form an overcoat 295. The overcoat 295 is formed to cover the liquid crystal injection hole 201 in an area where the space 200 is exposed, and to seal the space 200 for each pixel area (P). The overcoat 295 may be formed of a material that does not react with the liquid crystal 3 molecules such as, for example, parylene.

The overcoat 295 may be thickly formed, or an organic insulator may be additionally formed on the overcoat 295 to flatten the substrate 110.

Next, the first polarizer 12 may be formed under the substrate 110, and the second polarizer 22 may be formed on the overcoat 295. The second polarizer 22 may be formed after flattening the upper portion of the overcoat 295.

In exemplary embodiments, forming the second polarizer 22 on the overcoat 295 may be omitted.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A display device, comprising:
a substrate comprising a pixel area;
a thin-film transistor formed on the substrate;
a pixel electrode connected to the thin-film transistor;
a common electrode formed on the pixel electrode;
a space formed between the pixel electrode and the common electrode; and
a roof layer formed on the common electrode,
wherein the common electrode and the roof layer comprise a protrusion protruding from at least one of an upper edge and a lower edge of the pixel area,
wherein the protrusion extends in a direction away from the pixel area, beyond a gate line, and into an adjacent pixel area,
wherein the gate line separates the pixel area and the adjacent pixel area.

2. The display device of claim 1, wherein the roof layer comprises an organic material.

3. The display device of claim 1, wherein
the pixel area and the adjacent pixel area are two of a plurality of pixel areas, and the pixel areas are disposed in a matrix shape, and
the common electrode and the roof layer cover an upper surface, a left surface, and a right surface of the space.

4. The display device of claim 3, further comprising:
an overcoat formed on the roof layer and sealing the space;
a liquid crystal injection hole exposing the space at the upper edge and the lower edge of the pixel area; and
liquid crystal molecules formed in the space,
wherein the overcoat covers the liquid crystal injection hole.

5. The display device of claim 4, further comprising:
a first polarizer formed under the substrate; and
a second polarizer formed on the overcoat,
wherein a transmissive axis of one of the first polarizer and the second polarizer is substantially parallel to the upper edge and the lower edge of the pixel area, and
a transmissive axis of the other of the first polarizer and the second polarizer is substantially perpendicular to the upper edge and the lower edge of the pixel area.

6. The display device of claim 1, wherein
the protrusion is triangular, and
the protrusion protrudes from a first end of the upper or lower edge of the pixel area, or a second end of the upper or lower edge of the pixel area, wherein the first and second ends oppose each other.

7. The display device of claim 6, wherein
the protrusion comprises a first edge extending from the first or second end of the upper or lower edge of the pixel area, and a second edge extending from an inner portion of the upper or lower edge of the pixel area.

8. The display device of claim 7, wherein the first and second edges of the protrusion substantially form a right-angled triangle with respect to a portion of the upper or lower edge of the pixel area between the first and second edges of the protrusion.

9. The display device of claim 1, wherein
the protrusion protrudes from a center area of the upper or lower edge of the pixel area, and the protrusion is triangular, quadrangular, or circular.

10. The display device of claim 1, wherein
the protrusion is triangular and protrudes between a center area of the upper or lower edge of the pixel area and a first end of the pixel area, or between the center area of the upper or lower edge of the pixel area and a second end of the pixel area, wherein the first and second ends of the pixel area oppose each other.

11. The display device of claim 1, wherein
the protrusion comprises a plurality of triangular protrusions protruding from the upper or lower edge of the pixel area, and vertexes of the triangular protrusions meet each other at the upper or lower edge of the pixel area.

12. The display device of claim 1, wherein
a distance of the protrusion from the upper or lower edge of the pixel area gradually increases as the protrusion extends from an end of the upper or lower edge of the pixel area towards a center area of the upper or lower edge of the pixel area.

13. The display device of claim 12, wherein the protrusion is triangular or a circular.

14. The display device of claim 1, wherein the protrusion protrudes from the upper edge and the lower edge of the pixel area.

15. A display device, comprising:
a substrate comprising a pixel area;
a thin-film transistor formed on the substrate;
a pixel electrode connected to the thin-film transistor;
a common electrode formed on the pixel electrode;
a space formed between the pixel electrode and the common electrode; and
a roof layer formed on the common electrode,
wherein the common electrode and the roof layer comprise a protrusion protruding from at least one of an upper edge and a lower edge of the pixel area,
wherein the protrusion protrudes from a center area of the upper or lower edge of the pixel area, and wherein
the protrusion is triangular and comprises a first edge and a second edge, each edge extending from the upper or lower edge of the pixel area,
a length of a portion of the upper or lower edge of the pixel area between the first and second edge of the protrusion is at least about 5 um and at most about equal to a width of the pixel area,
a height of the protrusion is at least about 5 um and at most about 30 um, and
the first and second edge of the protrusion each forms an angle of at least about 10 degrees and at most about 80 degrees with the upper or lower edge of the pixel area.

* * * * *